United States Patent
Ku et al.

(10) Patent No.: US 11,264,561 B2
(45) Date of Patent: Mar. 1, 2022

(54) MAGNETIC RANDOM ACCESS MEMORY DEVICE AND FORMATION METHOD THEREOF

(71) Applicant: TAIWAN SEMICONDUCTOR MANUFACTURING CO., LTD., Hsinchu (TW)

(72) Inventors: Ming-Che Ku, Hsinchu (TW); Jun-Yao Chen, Taoyuan (TW); Sheng-Huang Huang, Hsinchu (TW); Jiun-Yu Tsai, Hsinchu (TW); Harry-Hak-Lay Chuang, Hsinchu County (TW); Hung-Cho Wang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 12 days.

(21) Appl. No.: 16/809,998

(22) Filed: Mar. 5, 2020

(65) Prior Publication Data
US 2021/0057639 A1 Feb. 25, 2021

Related U.S. Application Data

(60) Provisional application No. 62/889,439, filed on Aug. 20, 2019.

(51) Int. Cl.
*H01L 43/02* (2006.01)
*H01L 27/22* (2006.01)
*H01L 43/12* (2006.01)

(52) U.S. Cl.
CPC ............ *H01L 43/02* (2013.01); *H01L 27/228* (2013.01); *H01L 43/12* (2013.01)

(58) Field of Classification Search
CPC ........ H01L 43/02; H01L 43/12; H01L 27/228
USPC ........................................................ 257/421
See application file for complete search history.

(56) References Cited

U.S. PATENT DOCUMENTS

2018/0158867 A1* 6/2018 Kim ...................... H01L 27/228

* cited by examiner

*Primary Examiner* — Tu-Tu V Ho
(74) *Attorney, Agent, or Firm* — Maschoff Brennan

(57) ABSTRACT

A method of forming a magnetic random access memory (MRAM) device includes forming a bottom electrode layer over a substrate including an inter-metal dielectric (IMD) layer having a metal line therein; forming a barrier layer over the bottom electrode layer; forming a magnetic tunnel junction (MTJ) layer stack over the bottom electrode layer; forming a dielectric layer over the MTJ layer stack; forming an opening in the dielectric layer to expose the barrier layer; filling the opening in the dielectric layer with a top electrode; after filling the opening in the dielectric layer with the top electrode, etching the dielectric layer to expose the barrier layer; and patterning the MTJ layer stack to form an MTJ stack that exposes the bottom electrode layer.

20 Claims, 20 Drawing Sheets

100

100

# MAGNETIC RANDOM ACCESS MEMORY DEVICE AND FORMATION METHOD THEREOF

CROSS-REFERENCE TO RELATED APPLICATION

This application claims priority to U.S. Provisional Application Ser. No. 62/889,439, filed Aug. 20, 2019, which is herein incorporated by reference in its entirety.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
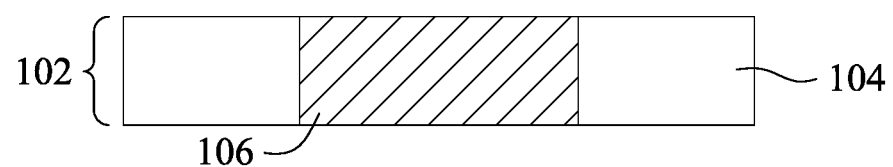
FIGS. 1-12 are cross-sectional views of the MRAM device at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The MTJ stack includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the MTJ stack is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ stack is in a lower resistive state, corresponding to a digital signal "0". When the magnetic moment of the ferromagnetic free layer is anti-parallel to that of the ferromagnetic pinned layer, the resistance of the MTJ stack is in a higher resistive state, corresponding to a digital signal "1". The MTJ stack is coupled between top and bottom electrode and an electric current flowing through the MTJ stack (tunneling through the tunnel barrier layer) from one electrode to the other is detected to determine the resistance and the digital signal state of the MTJ stack.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes, for example, silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIG. 1 is a cross-sectional view of a MRAM device 100 at an intermediate stage of manufacture according to various embodiments of the present disclosure. Reference is made to FIG. 1. In some embodiments, an interconnect structure 102 having an inter-layer dielectric (ILD) layer or inter-metal dielectric layer (IMD) layer 104 with a metallization pattern 106 (e.g., metal line) is formed over a substrate (not shown in FIG. 1). The ILD layer 104 may be silicon oxide, fluorinated silica glass (FSG), carbon doped silicon oxide, tetra-ethyl-ortho-silicate (TEOS) formed oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 106 may be aluminum, aluminum alloy, copper, copper alloy, titanium, titanium nitride, tantalum, tantalum nitride, tungsten, the like, and/or combinations thereof. Formation of the metallization pattern 106 and the ILD layer 104 may be a dual-damascene process and/or a single-damascene process.

Figure 2:
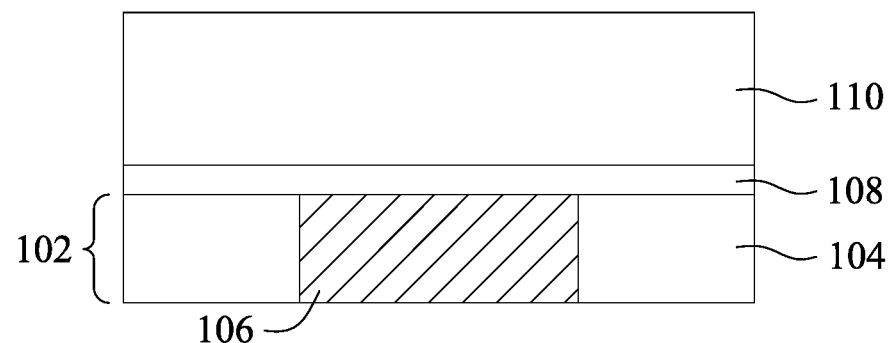

FIG. 2 is a cross-sectional view of the MRAM device 100 at an intermediate stage of manufacture according to various embodiments of the present disclosure. Reference is then made to FIG. 2. An etch stop layer 108 may be blanket formed over the interconnect structure 102. The etch stop layer 108 controls the end point of a subsequent etch process. In various embodiments, the etch stop layer 108 may be formed by a vapor deposition technique (e.g., physical vapor deposition, chemical vapor deposition, etc.) and include hydrogen and nitrogen doped carbide (HNDC), silicon nitride (SiN), silicon carbide (SiC), silicon oxycarbide (SiOC), and/or some other suitable materials. In some embodiments, a thickness of the etch stop layer 108 is in a range from about 200 Angstroms to about 300 Angstroms.

A first dielectric layer 110 is formed over the etch stop layer 108. The first dielectric layer 110 may be formed by acceptable deposition techniques, such as chemical vapor deposition (CVD), atomic layer deposition (ALD), physical vapor deposition (PVD), the like, and/or a combination thereof. A chemical-mechanical polish (CMP) process is optionally performed to the first dielectric layer 110, until a desirable thickness is achieved. The first dielectric layer 110 can be, for example, silicon rich oxide (SRO), silicon dioxide layer, silicon carbide layer, silicon nitride layer, silicon oxycarbide layer, silicon oxynitride layer, low-k dielectric (e.g., having a dielectric constant of less than about 3.9) layer, extreme low-k (ELK) dielectric (e.g., having a dielectric constant of less than about 2.5) layer, the like, or combinations thereof. In some embodiments, a thickness of the first dielectric layer is in a range from about 500 Angstroms to about 700 Angstroms.

Figure 3:
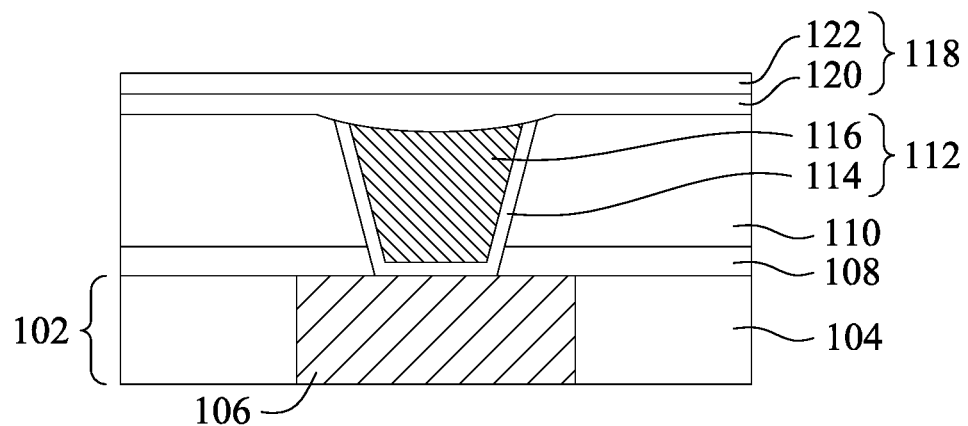
Figure 11:
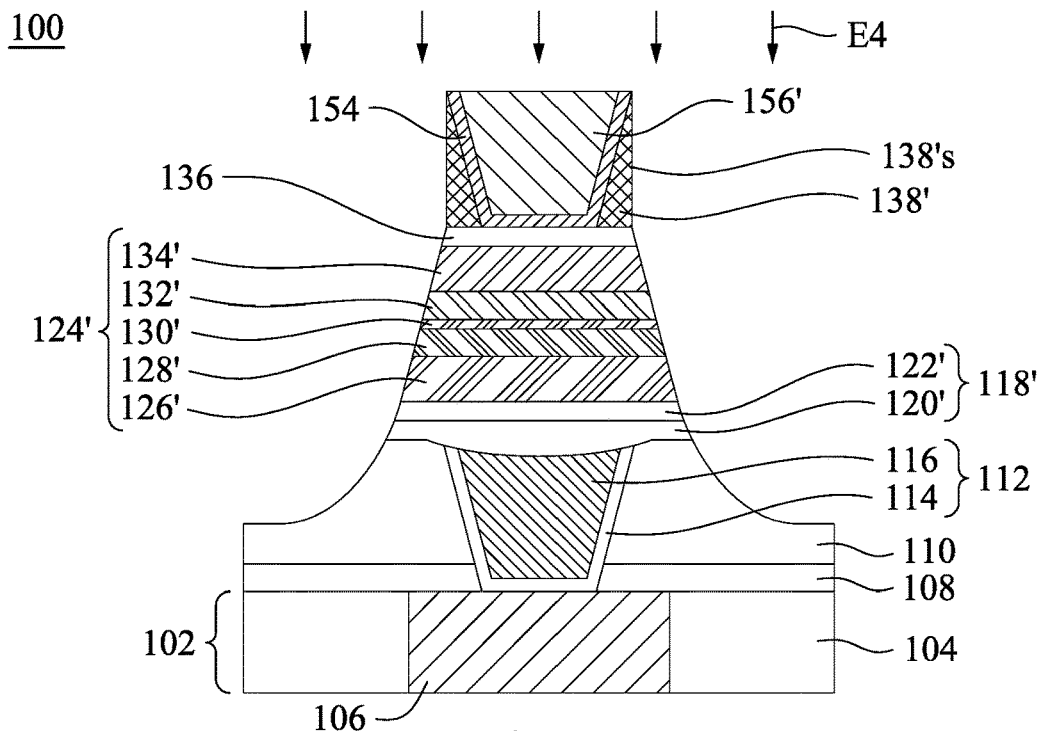

A bottom electrode via (BEVA) 112 is then formed within the first dielectric layer 110 and the etch stop layer 108, as illustrated in FIG. 3. In some embodiments, the BEVA 112 is a multi-layered structure and includes, for example, a diffusion barrier layer 114 and a filling metal 116 filling a recess in the diffusion barrier layer 114. An exemplary formation method of the BEVA 112 includes etching an opening in the first dielectric layer 110 and the etch stop layer 108, forming in sequence the diffusion barrier layer 114 and the filling metal 116 into the opening, and performing a planarization process, such as a CMP process, to remove excess materials of the filling metal 116 outside the opening in the first dielectric layer 110. The remaining diffusion barrier layer 114 and the remaining filling metal 116 in the opening in the first dielectric layer 110 and the etch stop layer can serve as the BEVA 112. In some embodiments, the BEVA 112 has a concave top surface, as illustrated in FIG. 3, due to the dishing effect of the CMP process. In some embodiments, the BEVA 112 is electrically connected to an underlying electrical component, such as a transistor (e.g., transistor as shown in FIG. 11), through the back-end-of-line (BEOL) interconnect structure that includes the metallization pattern 106. In some embodiments, the filling metal 116 is titanium (Ti), tantalum (Ta), platinum (Pt), ruthenium (Ru), tungsten (W), aluminum (Al), copper (Cu), the like, and/or combinations thereof. Formation of the filling metal may be exemplarily performed using CVD, PVD, ALD, the like, and/or a combination thereof.

A bottom electrode layer 118 is then blank formed over the BEVA 112 and over the first dielectric layer 110, so that the bottom electrode layer 118 extends along top surfaces of the BEVA 112 and of the first dielectric layer 110. The bottom electrode layer 118 can be a multi-layered structure. For example, the bottom electrode layer 118 may be double-layered. In some embodiments, the bottom electrode layer 118 includes a TiN layer 120 and a TaN layer 122 over the TiN layer 120. In some embodiments, a thickness of the TiN layer 120 is in a range from about 80 Angstroms to about 120 Angstroms. In some embodiments, a thickness of the TaN layer 122 is in a range from about 80 Angstroms to about 120 Angstroms. Formation of the bottom electrode layer 118 may be exemplarily performed using CVD, PVD, ALD, the like, and/or a combination thereof. For example, the TiN layer 120 is deposited upon the first dielectric layer 110 and the BEVA 112, followed by planarizing a top surface of the deposited TiN layer 120, and the TaN layer 122 is then deposited on the planarized top surface of the TiN layer 120. In this way, the resultant TiN layer 120 has a greater thickness above than BEVA 112 than above the first dielectric layer 110. This is because the BEVA 112 has a concave surface lower than the top surface of the first dielectric layer 110. Moreover, the resultant TiN layer 120 has a convex surface interfaced with the concave surface of the BEVA 112.

A magnetic tunnel junction (MTJ) layer stack 124 is formed over the bottom electrode layer 118. The MTJ layer stack 124 include a seed layer 126, a ferromagnetic pinned layer 128, a tunneling layer 130, a ferromagnetic free layer 132, and a capping layer 134 formed in sequence over the bottom electrode layer 118. The seed layer 126 includes Ta, TaN, Cr, Ti, TiN, Pt, Mg, Mo, Co, Ni, Mn, or alloys thereof, and serves to promote a smooth and uniform grain structure in overlying layers. The seed layer 126 may have a thickness in a range from about 10 Angstroms to about 30 Angstroms in some embodiments. The ferromagnetic pinned layer 128 may be formed of an anti ferromagnetic (AFM) layer and a pinned ferroelectric layer over the AFM layer. The AFM layer is used to pin or fix the magnetic direction of the overlying pinned ferroelectric layer. The ferromagnetic pinned layer 128 may be formed of, for example, ferroelectric metal or alloy (e.g., Co, Fe, Ni, B, Mo, Mg, Ru, Mn, Ir, Pt, or alloys thereof).

The tunneling layer 130 is formed over the ferromagnetic pinned layer 128. The tunneling layer 130 is thin enough that electrons are able to tunnel through the tunneling layer 130 when a biasing voltage is applied on a resulting MTJ stack 124' fabricated from the MTJ layer stack 124 (see FIG. 10). In some embodiments, the tunneling layer 130 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$), or combinations thereof. Exemplary formation methods of the tunneling layer 130 include sputtering, PVD, ALD, or the like.

Figure 4:
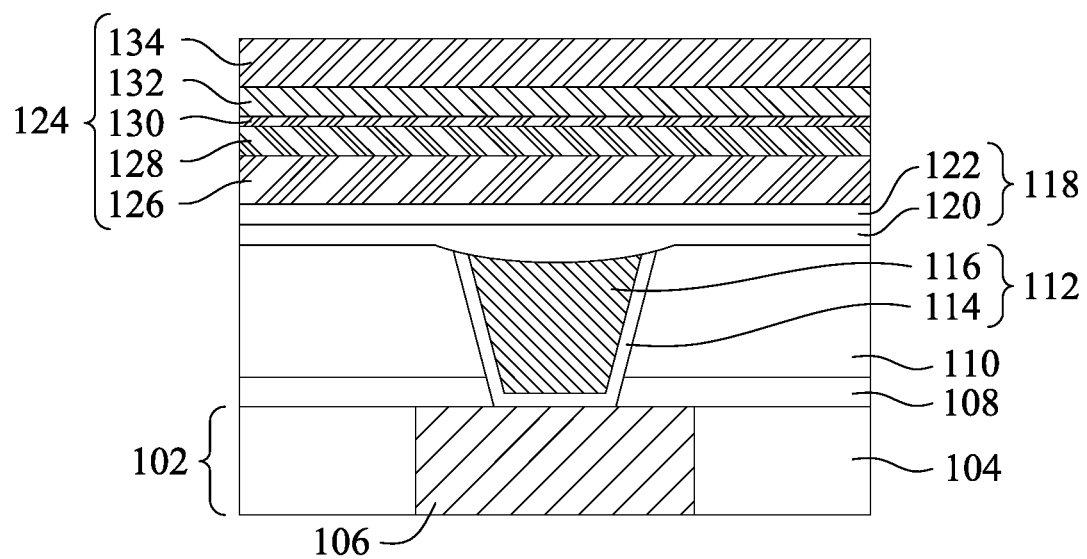

Still referring to FIG. 4, the ferromagnetic free layer 132 is formed over the tunneling layer 130. A direction of a magnetic moment of the ferromagnetic free layer 132 is not pinned because there is no anti-ferromagnetic material adjacent the ferromagnetic free layer 132. Therefore, the magnetic orientation of this layer 132 is adjustable, thus the layer 132 is regarded as a free layer. In some embodiments, the direction of the magnetic moment of the ferromagnetic free layer 132 is free to rotate parallel or anti-parallel to the pinned direction of the magnetic moment of the ferromagnetic pinned layer 128. The ferromagnetic free layer 132 may include a ferromagnetic material similar to the material in the ferromagnetic pinned layer 128. In some embodiments, the ferromagnetic free layer 132 includes Co, Fe, B, Mo, or combinations thereof. Exemplary formation methods of the ferromagnetic free layer 132 include sputtering, PVD, ALD, or the like. A total thickness of the ferromagnetic pinned layer 128, the tunneling layer 130, and the ferromagnetic free layer 132 is in a range from about 200 Angstroms to about 250 Angstroms.

The capping layer 134 is deposited over the ferromagnetic free layer 132. The capping layer 134 includes Ta, Co, B, Ru, Mo, MgO, AlO, or combinations thereof. In some embodiments, a thickness of the capping layer 134 is in a range from about 20 Angstroms to about 40 Angstroms. The capping layer 134 may be deposited by PVD or alternatively other suitable processes.

Figure 5A:
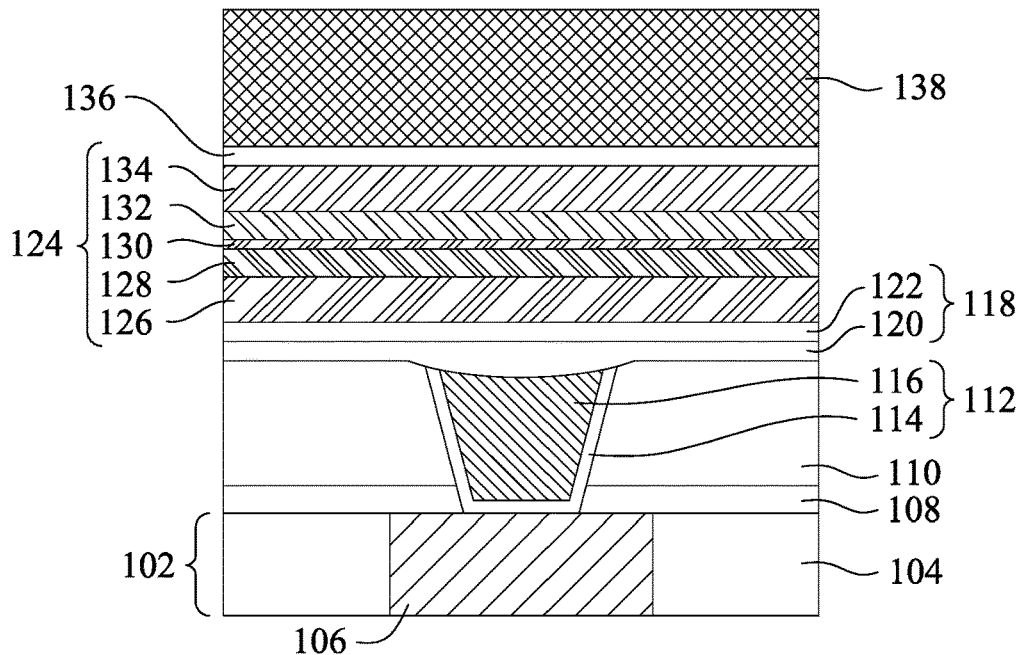

Reference is made to FIG. 5A. A barrier layer 136 is formed as a blanket planar layer over the capping layer. The barrier layer 136 acts as an etch stop layer during a subsequent etching process. The barrier layer 136 controls the end point of a subsequent etch process. In various embodiments, the barrier layer 136 may be formed by a vapor deposition technique (e.g., physical vapor deposition, chemical vapor deposition, etc.) and include hydrogen and nitrogen doped carbide (HNDC), a silicon nitride (SiN), a silicon carbide (SiC), silicon oxycarbide (SiOC), and/or some other suitable materials. A second dielectric layer 138 is formed on the barrier layer 136. The second dielectric layer 138 may include oxides, SiC, SiON, or the like. The second dielectric layer 138 may be formed by acceptable deposition techniques, such as chemical vapor deposition (CVD), atomic layer deposition (ALD), physical vapor deposition (PVD), the like, and/or a combination thereof. A chemical-mechanical polish (CMP) process is optionally performed to the second dielectric layer 138, until a desirable thickness is achieved.

Figure 5B:
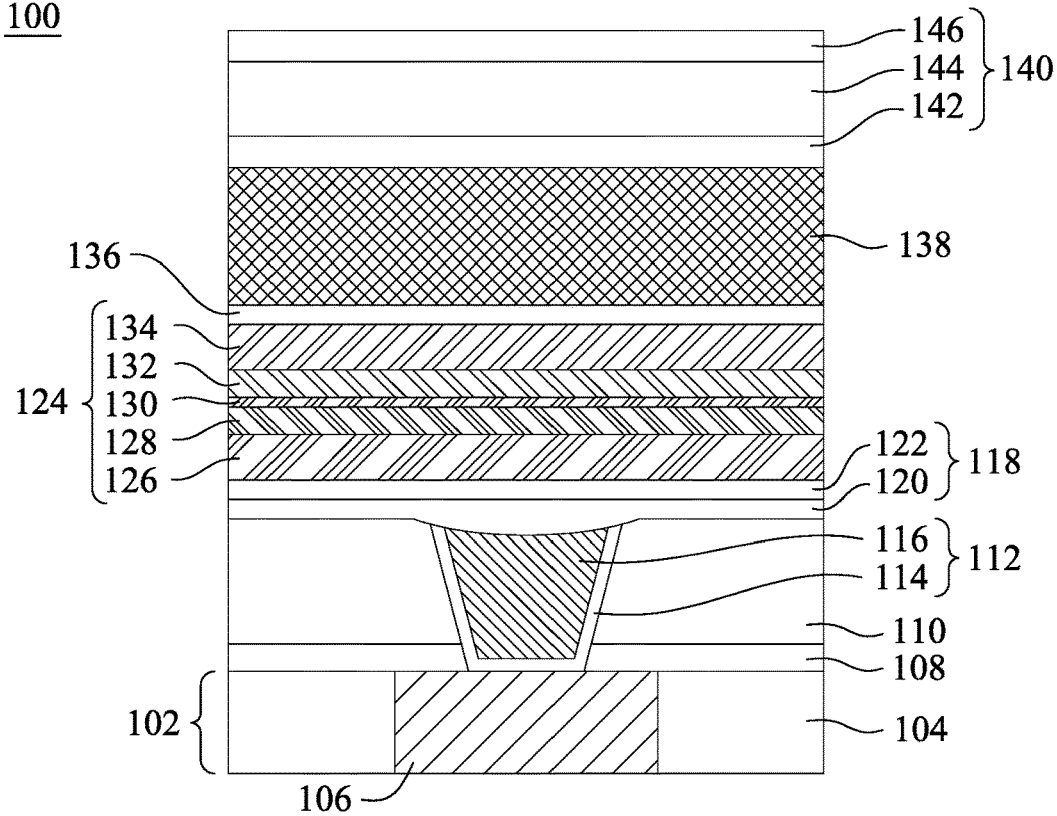

A lithography mask 140 is formed on the second dielectric layer 138. In some embodiments, the lithography mask 140 is a tri-layer mask as shown in FIG. 5B. For example, the lithography mask 140 includes a bottom layer 142, a middle layer 144 and a top photoresist layer 146. However, thin top photoresist layer 146 may not be sufficiently robust to support the etching of target layers (e.g., the second dielectric layer 138). The tri-layer photoresist provides a relatively thin top photoresist layer 146. The middle layer 144 may include anti-reflective materials (e.g., a backside anti-reflective coating (BARC) layer) to aid the exposure and focus of the top photoresist layer 146's processing. By having the middle layer 144, the thin top photoresist layer 146 is only used to pattern the middle layer 144. The bottom layer 142 may include a hard mask material such as a carbon-containing material that is easily removed by $O_2$ or a $N_2/H_2$ plasma. The middle layer 144 is used to pattern the bottom layer 142. In some embodiments, the middle layer 144 has a high etch selectivity to the bottom layer 142. Thus, the tri-layer photoresist 140 allows for the robust patterning of underlying layers (e.g., the dielectric layers) while still providing a relatively thin top photoresist layer 146.

Figure 5C:
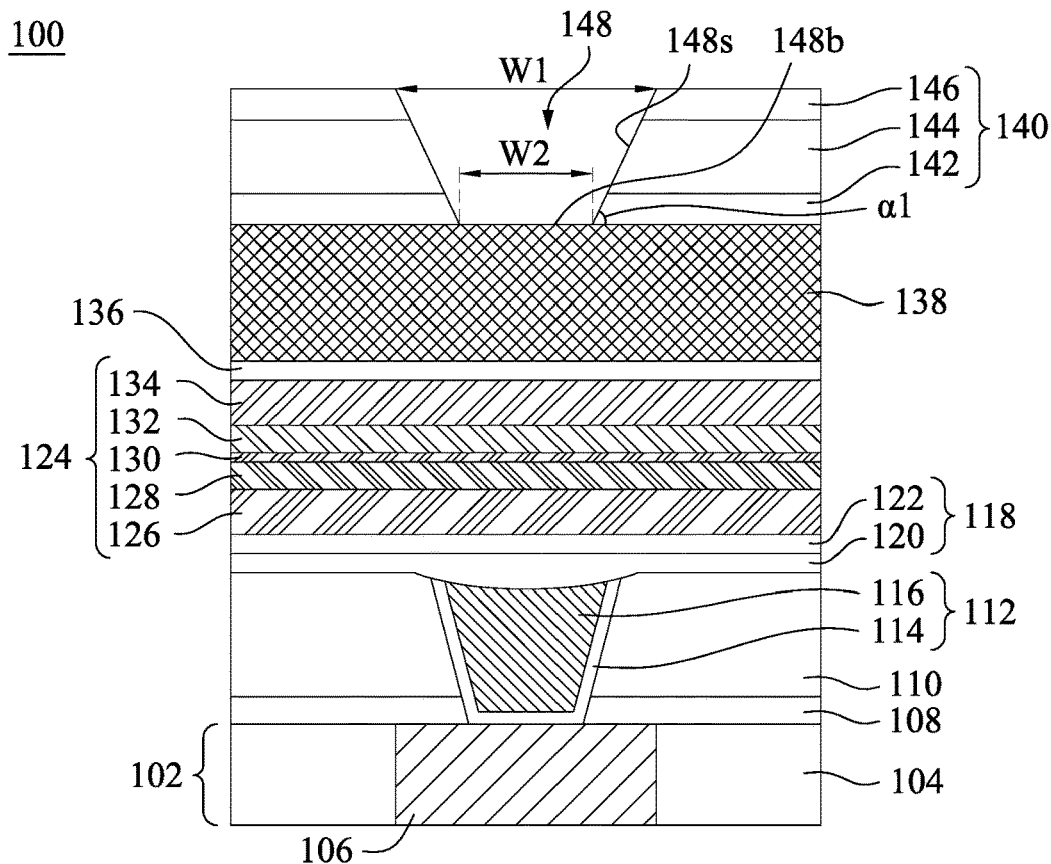

FIG. 5C illustrate the resulting structure after the lithography mask 140 has been patterned forming an opening 148. The second dielectric layer 138 is exposed to the opening 148. The opening 148 has an inverted trapezoid profile in a cross-sectional view. In other words, a top width W1 of the opening 148 is greater than a bottom width W2 of the opening 148. The opening 148 has a bottom surface 148*b* and a sidewall 148*s* slanted relative to the bottom surface 148*b* at an obtuse angle α1, which in turn results in a desired inverted trapezoid profile of a subsequently formed recess.

Figure 5D:
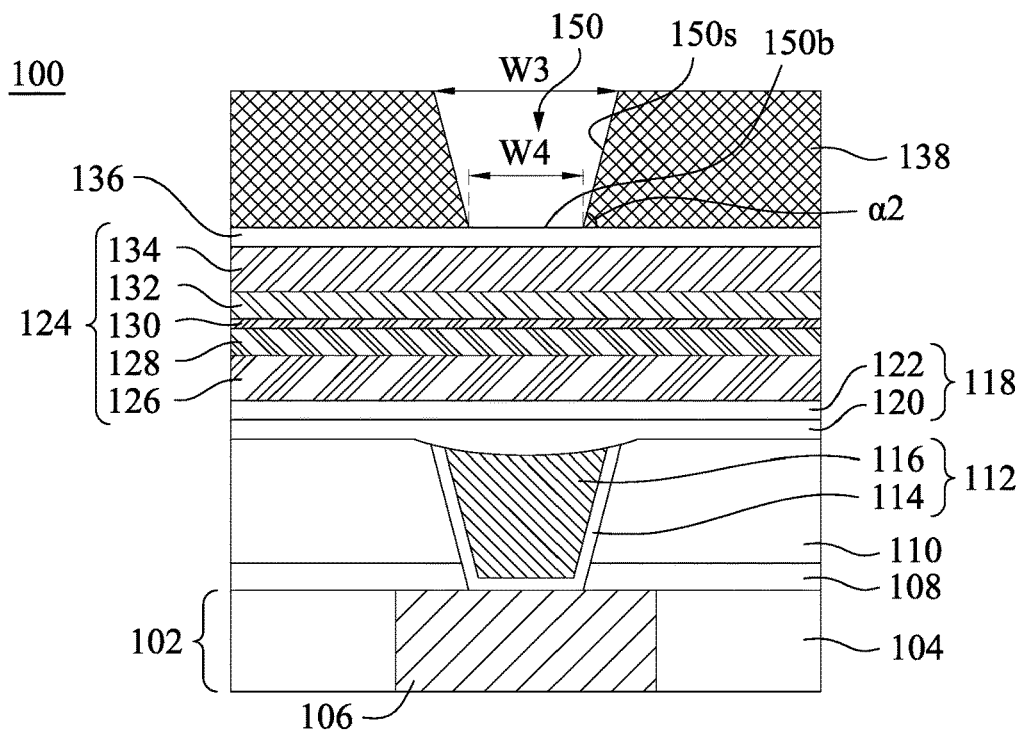

Reference is then made to FIG. 5D. The second dielectric layer 138 is patterned to form a recess 150 therein. The bottom layer 142, the middle layer 144 and the top photoresist layer 146 are removed thereafter. The barrier layer 136 is exposed through the recess 150. Due to the opening 148 with the inverted trapezoid shape in the lithography mask 140, the recess 150 has an inverted trapezoid shape as well. In other words, a top width W3 of the recess 150 is greater than a bottom width W4 of the recess 150. The recess 150 has a bottom surface 150*b* and a sidewall 150*s* slanted relative to the bottom surface 150*b* at an obtuse angle α2, which in turn results in a desired inverted trapezoid profile of a subsequently formed top electrode.

Figure 6A:
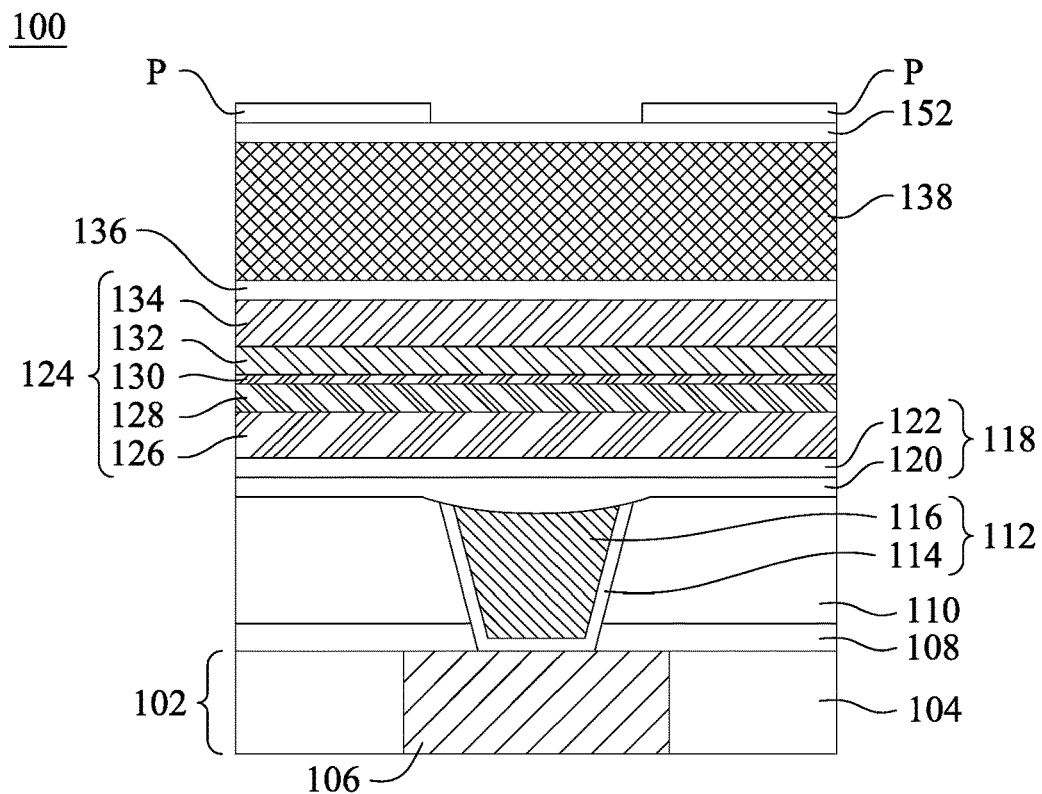
Figure 6B:
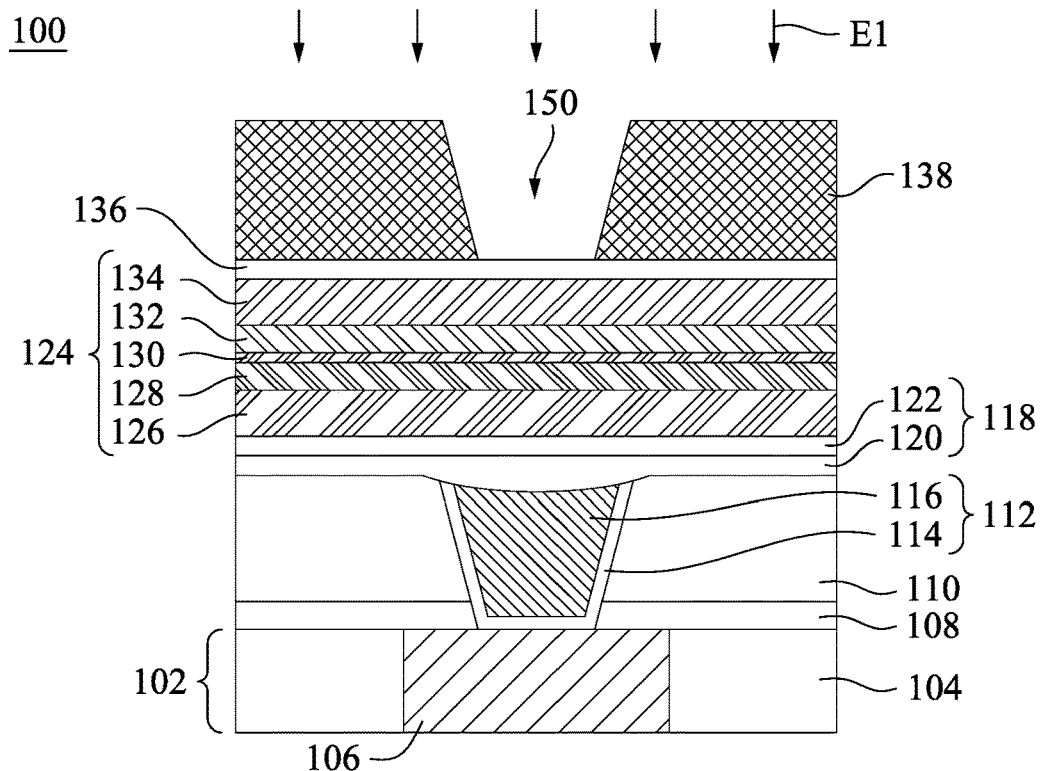

FIGS. 6A and 6B illustrate an alternative process of forming the recess 150 in the second dielectric layer 138. Reference is made to FIG. 6A. A hard mask layer 152 is formed over the second dielectric layer 138. In some embodiments, the hard mask layer 152 may be silicon carbide (SiC), silicon oxynitride (SiON), silicon nitride (SiN), silicon dioxide ($SiO_2$), the like, and/or combinations thereof. The hard mask layer 152 may be formed by acceptable deposition techniques, such as CVD, ALD, PVD, the like, and/or combinations thereof.

In some embodiments, a patterned resist mask P is formed over the hard mask layer 152. A resist layer is formed over the hard mask layer 129 and then patterned into a patterned resist mask P using a suitable photolithography process, such that portions of the hard mask layer 152 are exposed by the patterned resist mask P. In some embodiments, the patterned resist mask P is a photoresist. In some embodiments, the patterned resist mask P is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

Reference is then made to FIG. 6B. The second dielectric layer 138 is patterned by an etching process E1 to form the recess 150' therein. The patterned resist mask P and the hard mask layer 152 are removed thereafter. The barrier layer 136 is exposed to the recess 150'. The recess 150' has an inverted trapezoid profile, as discussed with regard to FIG. 5D. In some embodiments, the etching process E1 includes using a first etching gas and a second etching gas. In some embodiments, the first etching gas is $CF_4$, and the second etching gas is $C_4F_8$. In order to regulate a ratio of the first etching gas to the second etching gas, a dilution gas is introduced during the etching process E1. The dilution gas may include any suitable gas, for example, $N_2$, $O_2$, Ar, or a combination thereof. Other etching parameters of the etching process E1, such as radio frequency (RF) bias power and RF frequency, can be tuned as well to achieve the trapezoid profile.

Figure 7:
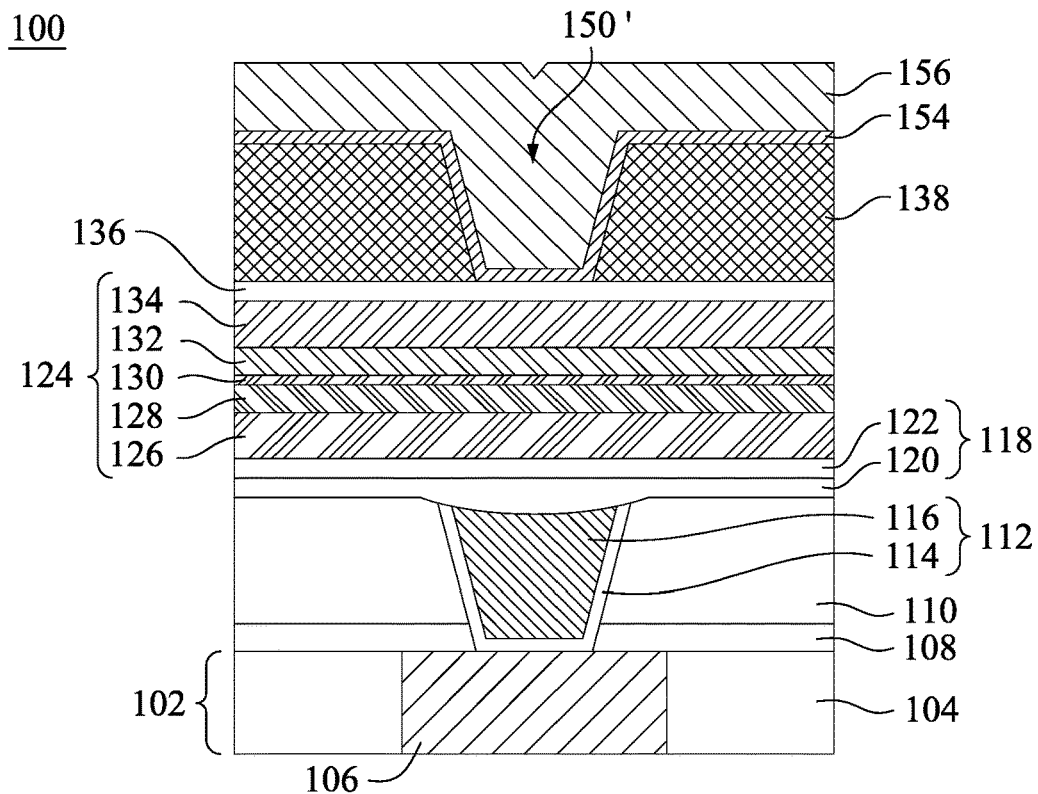

Reference is made to FIG. 7. An adhesion layer 154 is conformally deposited over the second dielectric layer 138, including along the surface of the recess 150 and over the exposed surface of the barrier layer 136. The adhesion layer 154 enhances the adhesion strength between the barrier layer 136, the second dielectric layer 138 and the overlying layer (e.g., the top electrode layer 156). The adhesion layer 154 may be formed by PVD, CVD, ALD, or other suitable technique. In some embodiments, the adhesion layer 154 is a tantalum-containing layer, for example, TaN. A top electrode layer 156 is formed over the adhesion layer 154 and fills the recess 150. The top electrode layer 156 is a titanium-containing layer. In some embodiments, the top electrode layer 156 includes TiN. The top electrode layer 156 may be formed by PVD, CVD, ALD, or other suitable technique.

Figure 8:
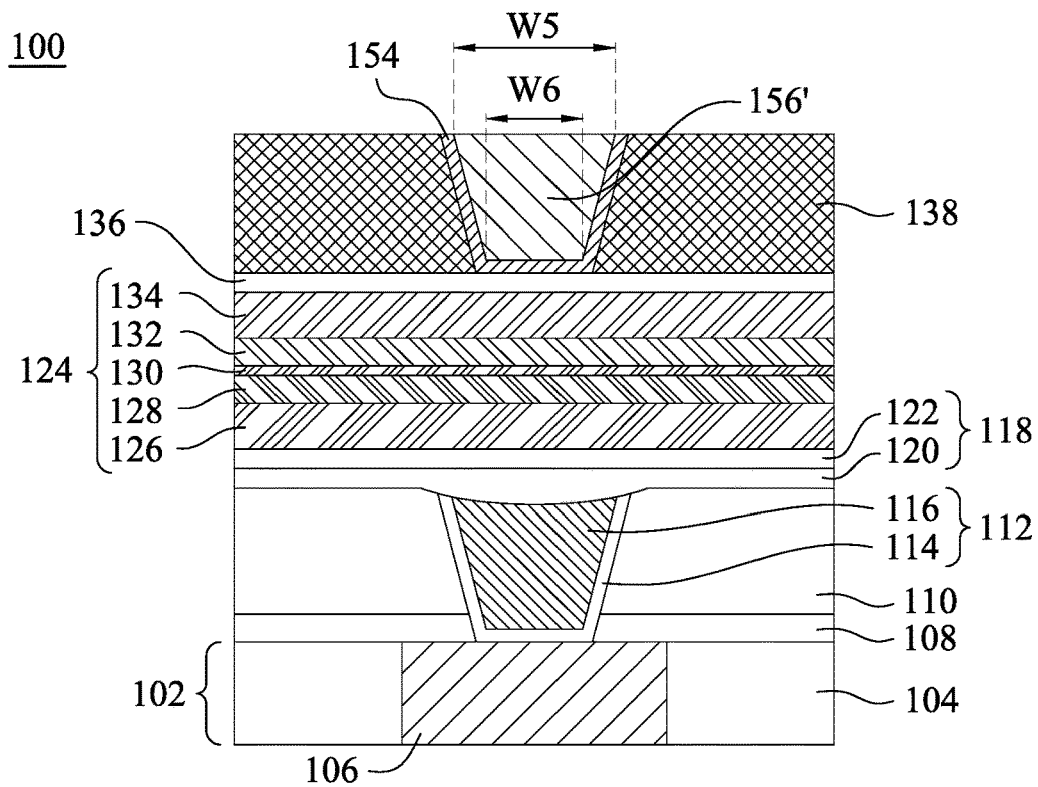

Reference is made to FIG. 8. A portion of the top electrode layer 156 outside the recess 150 is removed, for example, through a suitable etch back process, and hence forming a top electrode 156'. In some embodiments, a chemical mechanical polishing (CMP) process is performed on the top electrode layer 156 to planarize the top electrode layer 156 until the second dielectric layer 138 is reached and exposed. The CMP process may selectively stop at the second dielectric layer 138. For example, the CMP process removes the metal materials of the top electrode layer 156 and the adhesion layer at a faster removal rate than the second dielectric layer 138, and thus the second dielectric layer 138 can serve as a CMP stop layer to slow down or even stop the CMP process. In this way, the top electrode 156' is formed by performing a deposition process and a CMP process in sequence. Thus, the top electrode 156' is formed without etching the metal material (e.g., TiN) of the top electrode 156', which in turn will prevent unwanted damages caused by etching the TiN material (e.g., damages to the MTJ stack 124' caused by chlorine etchants).

A profile of the top electrode 156' is substantially the same as a profile of the recess 150. Due to the inverted trapezoid profile of the recess 150, the top electrode 156' has an inverted trapezoid profile as well. In other words, a top width W5 of the top electrode 156' is greater than a bottom width W6 of the top electrode 156'. In some embodiments, the top width W5 is in a range from about 250 Angstroms to about 1100 Angstroms. In some embodiments, the bottom width W6 is in a range from about 200 Angstroms to about 800 Angstroms.

Figure 9:
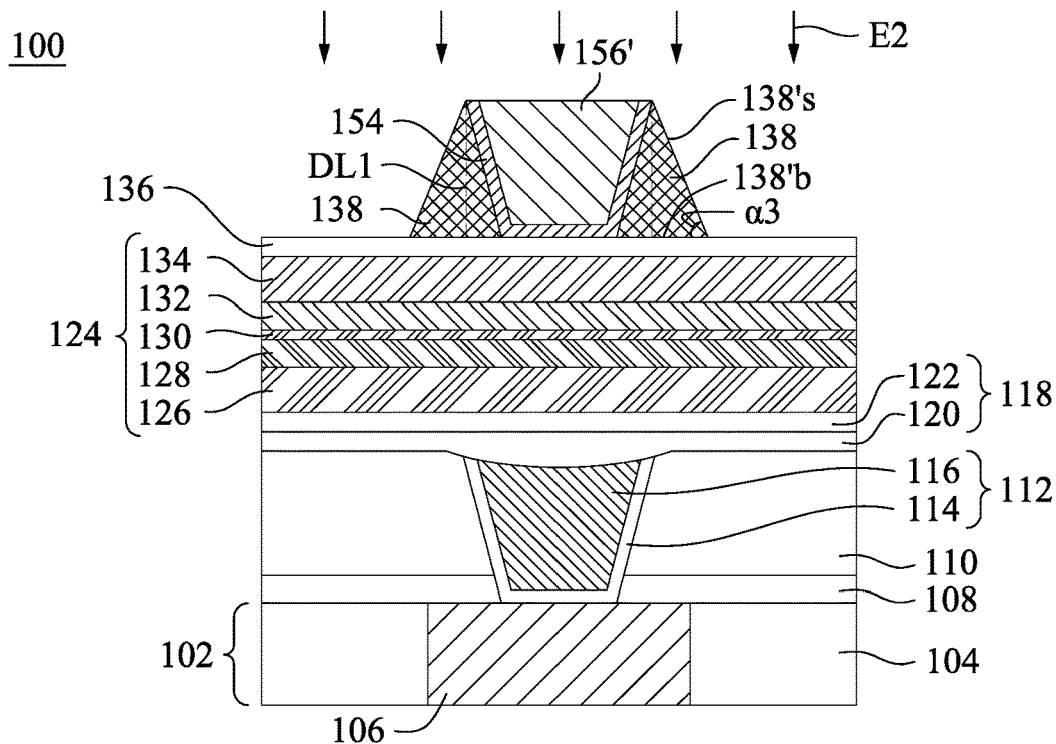

Reference is made to FIG. 9. An etching process E2 is performed to pattern the second dielectric layer 138 to expose the barrier layer 136. The etching process E2 is a self-aligned etch process, because the remaining second dielectric layer 138 is self-aligned to the top electrode 156' without using an additional photolithography process and an associated mask. In greater detail, the etching process E2 etches the second dielectric layer 138 at a faster etch rate than it etches the top electrode 156' and the adhesion layer 154, thus the etching process E2 removes second dielectric layer 138 using the top electrode 156' and the adhesion layer 154 as an etch mask. Due to the shadow effect resulting from the top electrode 156', after the etching process E2, the second dielectric layer 138 is patterned as first spacers 138' extend along sidewalls of the adhesion layer 154, respectively. The second spacers 138 are formed as triangular geometry spacers (triangular shaped spacer) in a cross-sectional view, as illustrated in FIG. 9. The first spacer 138' has a bottom surface 138'b and a sidewall 138's slanted relative to the bottom surface 138'b at an acute angle α3. Although the first spacers 138' illustrated in FIG. 9 have inclined sidewalls 138's, the etching process E2 may lead to vertical sidewalls 138's (resulting from over-etching during the etching process E2), as indicated by dashed line DL1, in some other embodiments.

The etching process E2 may be an anisotropic etching process. For example, the etching process E2 is a dry etching process, for example, an ion beam etch (IBE) process. The second dielectric layer 138 has an etch selectivity or etch speed that is higher than the top electrode 156'. Therefore, the etching process E2 can remove the portion of the second dielectric layer 138 easily and loss of the top electrode 156' is minimized.

Figure 10:
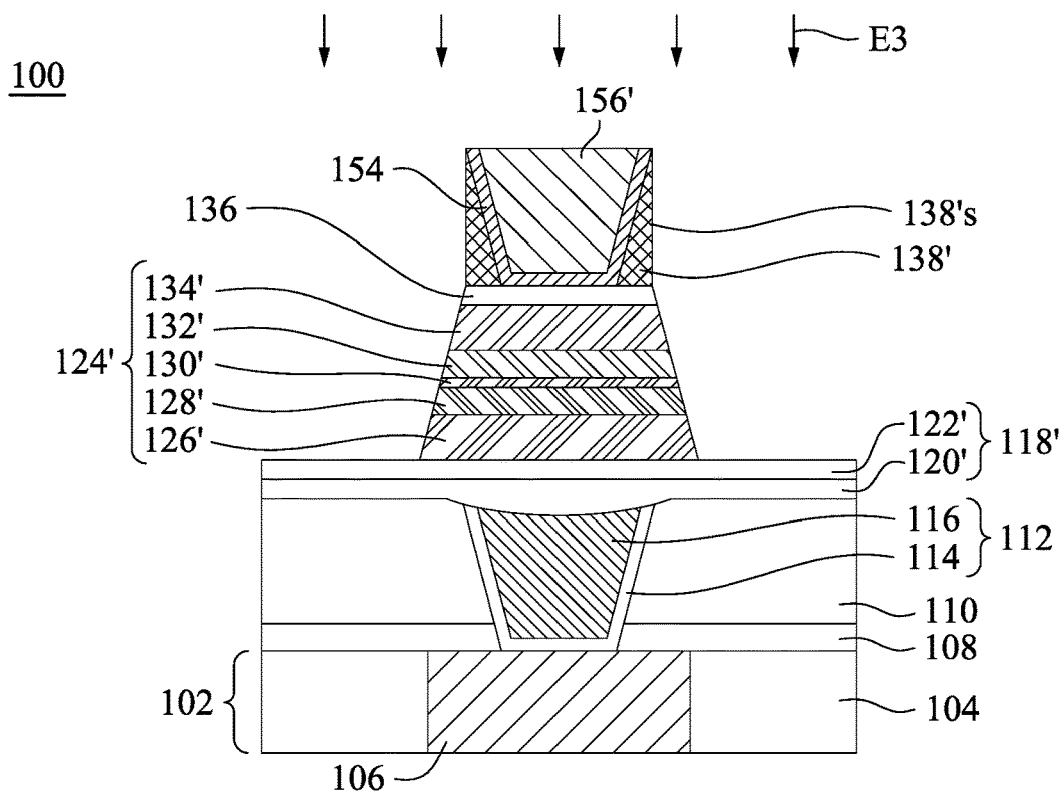

Reference is made to FIG. 10. An etching process E3 is performed to pattern the MTJ layer stack 124 to expose the bottom electrode layer 118. In other words, patterning the MTJ layer stack 124 stops on the bottom electrode layer 118. For example, the TaN layer 122 is exposed after the etching process E3. The etching process E3 is a self-aligned etch process. In greater detail, the etching process E3 uses the top electrode 156', the adhesion layer 154 and the first spacers 138' as an etch mask. The etching process E3 removes portions of the MTJ layer stack 124 not protected by the top electrodes 156', the adhesive layer 154 and the first spacers 138' as well as removes portions of the first spacers 138'. The first spacers 138' have reduced bottom surfaces after patterning the MTJ layer stack 124. In some embodiments, the etching process E3 may lead to vertical sidewalls 138's. After the etching process E3, remaining capping layers 134', remaining ferromagnetic free layers 132', remaining tunneling layers 130', remaining ferromagnetic pinned layers 128', and remaining seed layers 126' are in combination regarded as an MTJ stack 124'. The first spacers 138" are shown to have a geometry of a right triangle.

The etching process E3 may be an anisotropic etching process. For example, the etching process E3 is a dry etching process, for example, an ion beam etch (IBE) process. The first spacers 138' reduce the likelihood of damage, and/or the re-deposition of by-products on sidewalls of the top electrode 156' caused by the etching process E3. Such damage and/or re-deposition leads to increased leakage current and/or reduced data retention in a memory cell. In some embodiments, etchants used in the etching process E3 includes alkanols, such as methanol ($CH_3OH$). The etching process E3 may lead to formation of sidewall dead layers surrounding sidewalls of the MTJ stack 124'. Such dead layers inevitably will result in current shunting, and thus reduce DR/R signal of the MRAM device.

Reference is made to FIG. 11. An etching process E4 is performed to pattern the bottom electrode layer 118 and the first dielectric layer 110 such that the first dielectric layer 110 is exposed. The bottom electrode layer 118 is patterned as a bottom electrode 118' under the MTJ stack. The etching process E4 can help remove sidewall dead layers. After the etching process E4, remaining TaN layer 122' and remaining TiN layer 120' are in combination regarded as the bottom electrode 118'.

Figure 12:
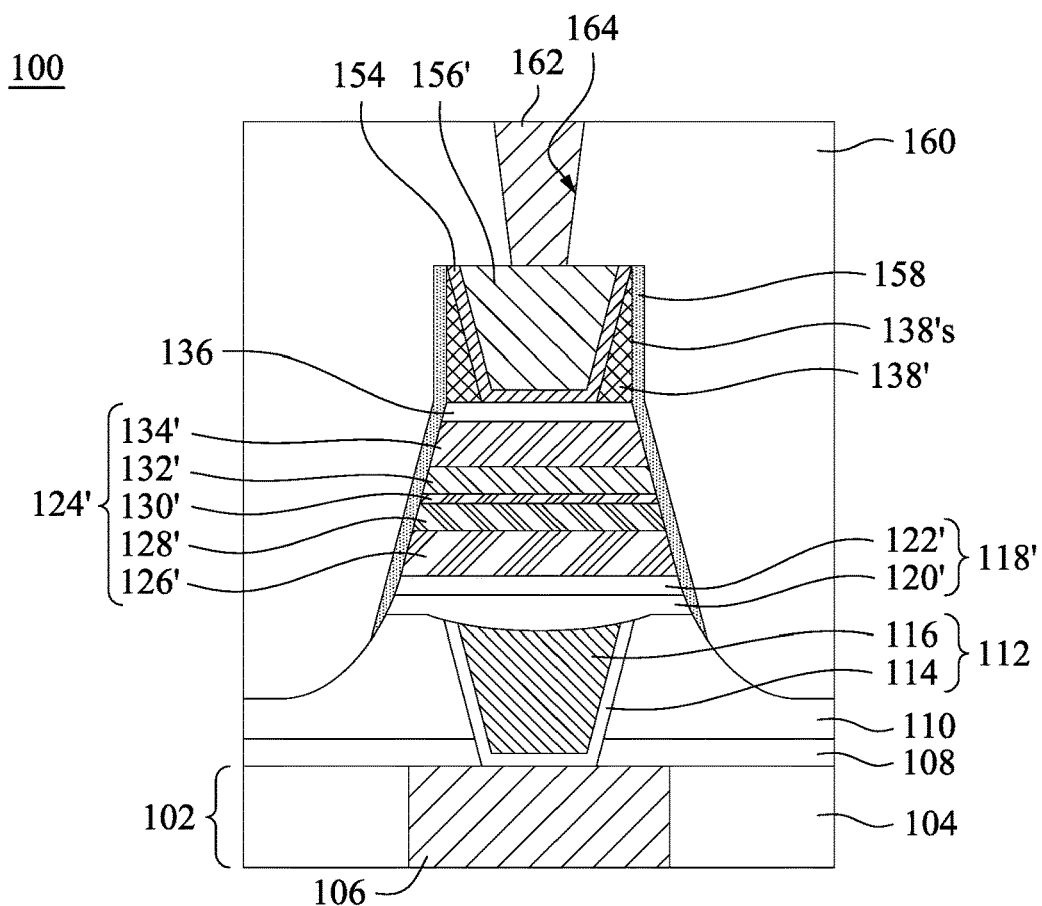

Reference is made to FIG. 12. A second spacer 158 is formed along sidewalls of the first spacers 138', the MTJ stack 124', and the bottom electrode 118'. In greater detail, the second spacer 158 laterally surrounds the first spacers 138', the MTJ stack 124', and the bottom electrode 118'. Another ILD layer 160 is formed over the interconnect structure 102, and an upper metallization pattern (e.g., a metal via) 162 is then formed in the ILD layer 160. Formation of the upper metallization pattern 162 may be formed by etching an opening 164 in the ILD layer 160, and then filling one or more metals in the opening to form the upper metallization pattern 162, so that the upper metallization patterns 162 can reach on the top electrode 156'. In some embodiments, the opening 164 and the metallization pattern 162 may be formed by a damascene process. For example, a via opening is formed through the ILD layer 160, and then filled with a conductive material (e.g., copper). A planarization process (e.g., CMP) is then performed.

In some embodiments, the ILD layer 160 may have the same material as the ILD layer 104. In some other embodiments, the ILD layer 160 may have a different material than the ILD layer 104. In some embodiments, the ILD layer 160 includes silicon oxide, fluorinated silica glass (FSG), carbon doped silicon oxide, tetra-ethyl-ortho-silicate (TEOS) formed oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

Figure 13:
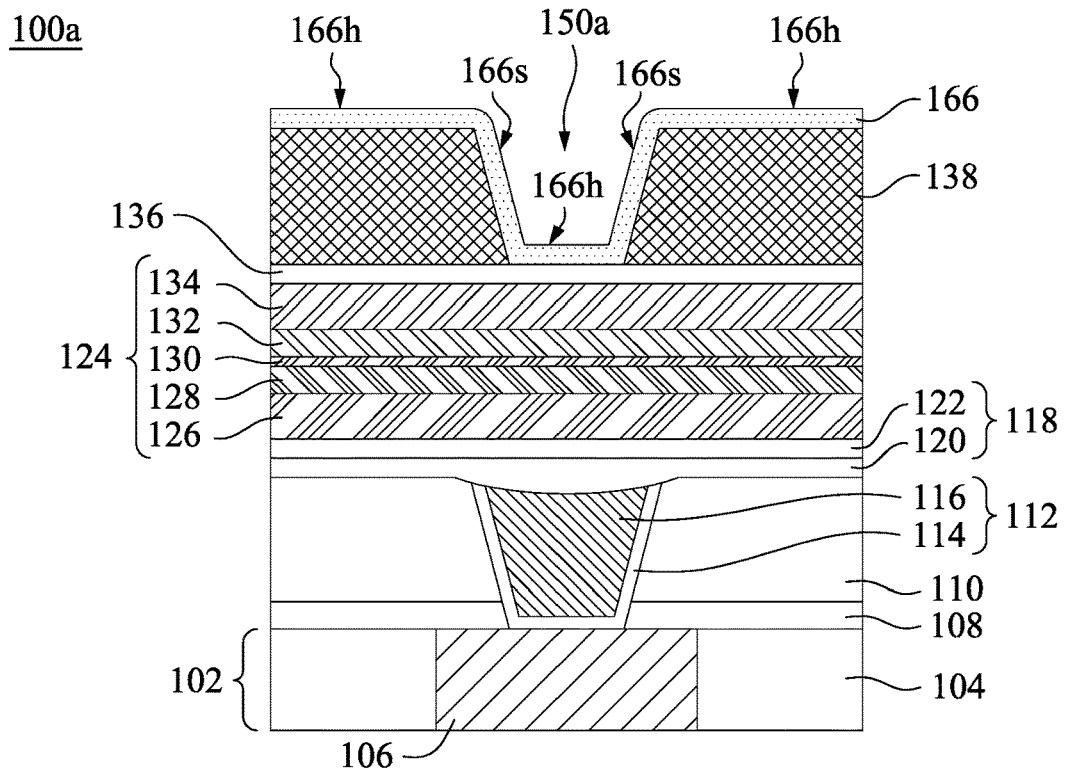
FIGS. 13-20 are cross-sectional views of the MRAM device at various intermediate stages of manufacture according to various embodiments of the present disclosure.

FIGS. 13-20 are cross-sectional views of the MRAM device 100a at various intermediate stages of manufacture according to various embodiments of the present disclosure. Reference is made to FIG. 13. A spacer layer 166 is conformally deposited over the second dielectric layer 138, including along the surface of the recess 150a and over the exposed surface of the barrier layer 136. In greater detail, the spacer layer 166 has horizontal portions 166h over the second dielectric layer 138 and the barrier layer 136 and slanted portions 166s along sidewalls of recess 150a. Due to the tapered profile of the recess 150a, the slanted portions 166s of the spacer layer 166 are slanted relative to the top surface of the barrier layer 136 at an angle. The spacer layer 166 may be formed by ALD or other suitable technique. In some embodiments, the spacer layer 166 may include aluminum oxide, titanium oxide, silicon nitride, or the like.

Figure 14:
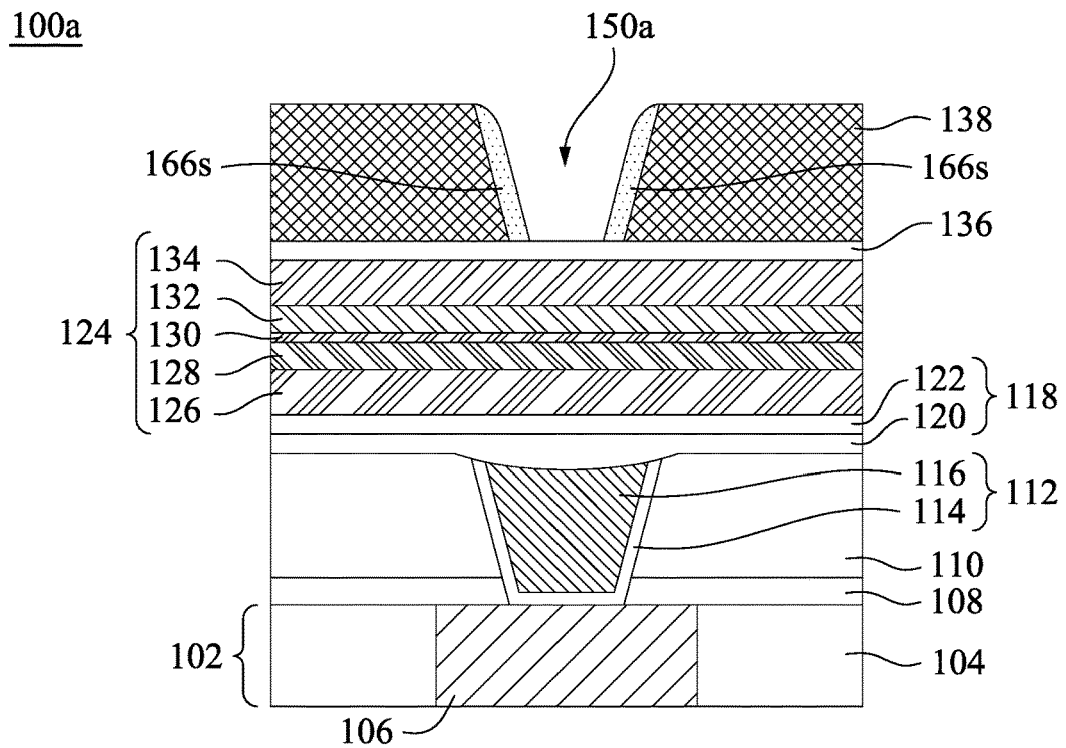

Reference is made to FIG. 14. Next, horizontal portions 166h of the spacer layer 166 are removed, and slanted portions 166s of the spacer layer 166 remain extending along sidewalls of the recess 150a. The slanted portions 166s may be regarded as sidewall spacers. Removal of the horizontal portions 166h of the spacer layer 166 can be performed using, for example, an anisotropic etching process (e.g., dry etching). The barrier layer 136 is exposed as a result of removing the horizontal portions 166h over the barrier layer 136. Advantageously, the slanted portions 166s of the spacer layer 166 result in reduced critical dimensions (CD) for a subsequently formed top electrode. The slanted portions 166s of the spacer layer 166 may be regarded as third spacers 166s hereafter.

Figure 15:
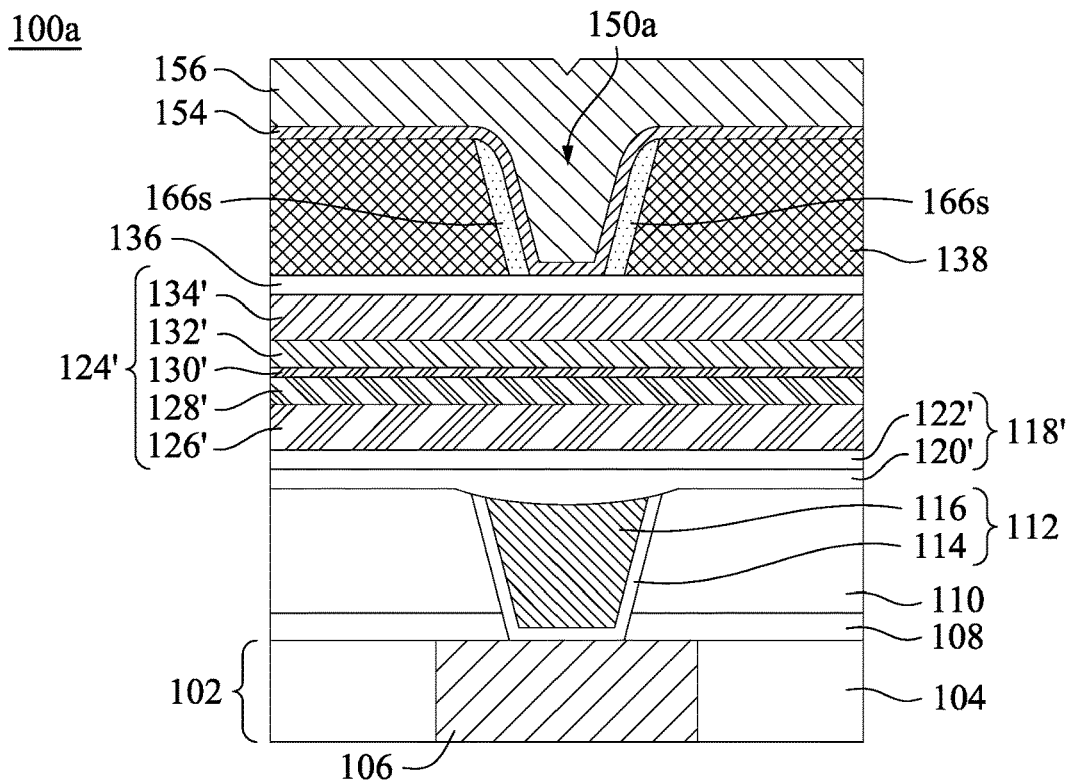

Reference is made to FIG. 15. An adhesion layer 154 is conformally deposited over the second dielectric layer 138, including along the surface of the third spacers 166s and over the exposed surface of the barrier layer 136. The adhesion layer 154 may be formed by PVD, CVD, ALD, or other suitable technique. In some embodiments, the adhesion layer 154 is a Ta-containing layer, for example, TaN. A top electrode layer 156 is formed over the adhesion layer 154 and fills the recess 150a. In some embodiments, the top electrode layer 156 includes TiN.

Figure 16:
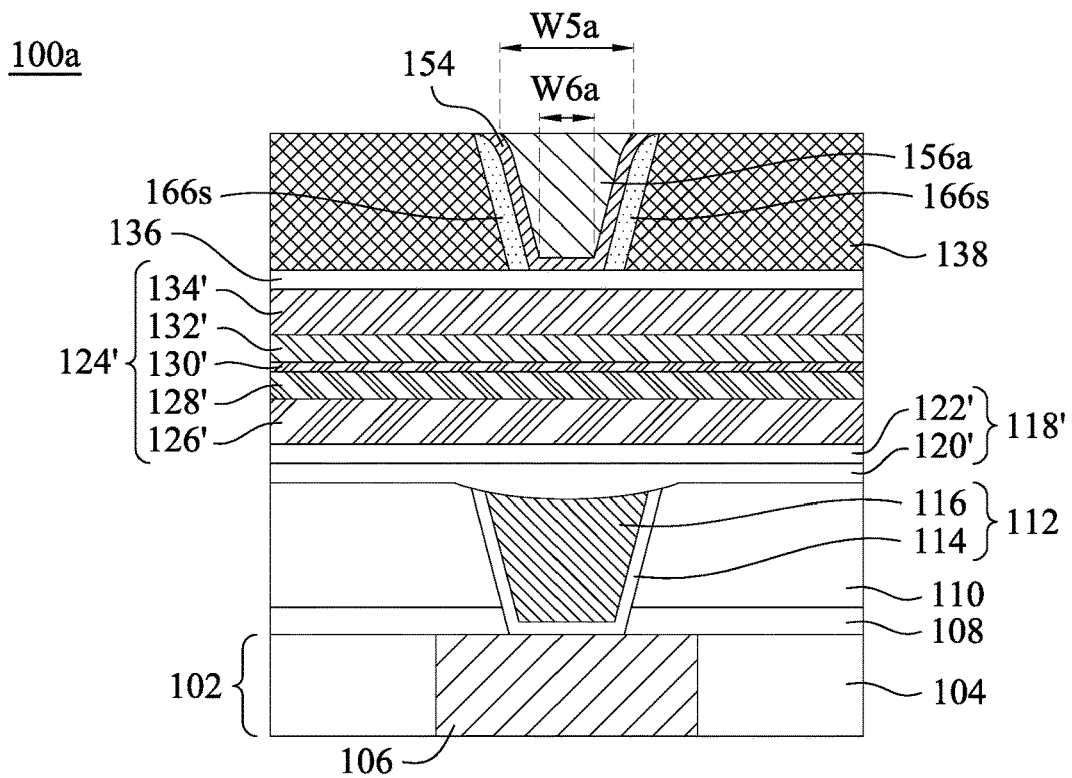

Reference is made to FIG. 16. A portion of the top electrode layer 156 outside the recess 150a is removed, for example, through a CMP process, and hence forming a top electrode 156a, as discussed previously with respect to FIG. 8. Due to the inverted trapezoid profile of the recess 150a, the top electrode 156a has an inverted trapezoid profile as well. In other words, a top width W5a of the top electrode 156a is greater than a bottom width W6a of the top electrode 156a. In some embodiments, the top width W5a is in a range from about 250 Angstroms to about 1050 Angstroms. In some embodiments, the bottom width W6a is in a range from about 200 Angstroms to about 800 Angstroms.

Figure 17:
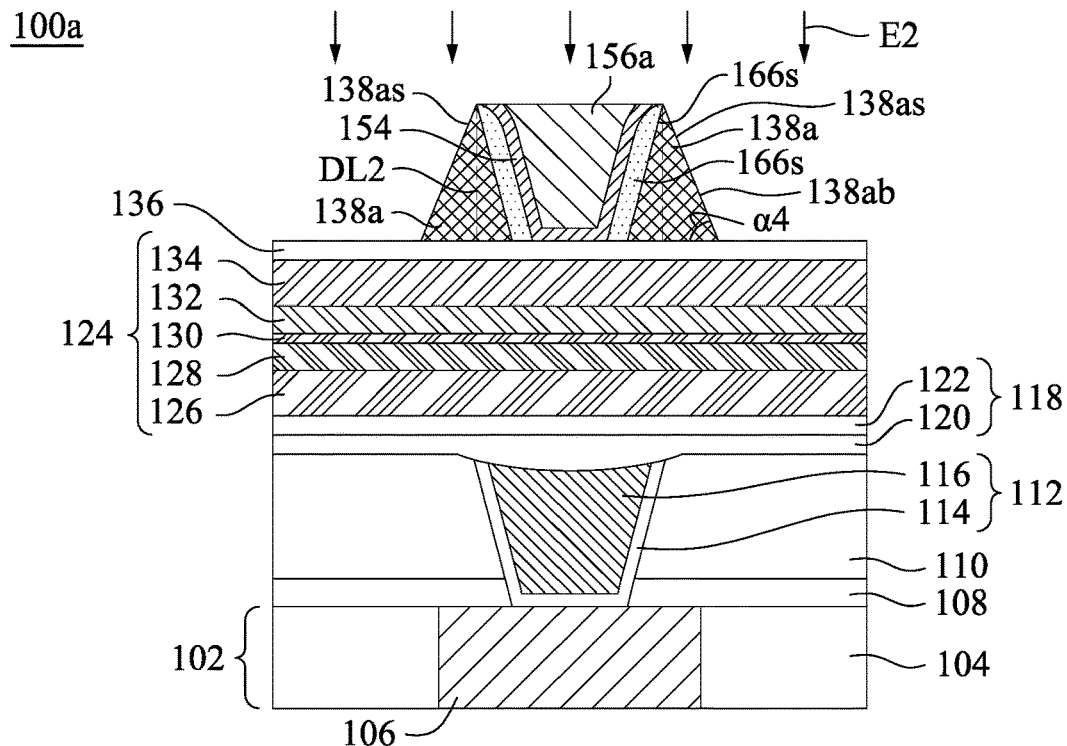

Reference is made to FIG. 17. An etching process E2 is performed to pattern the second dielectric layer 138 to expose the barrier layer 136. In greater detail, the etching process E2 removes portions of the second dielectric layer 138 using the top electrode as an etch mask, as discussed previously with respect to FIG. 9. After the etching process E2, the second dielectric layer 138 is patterned as first spacers 138a extend along sidewalls of the third spacers 166s, respectively. The first spacers 138a are formed as triangular geometry spacers (triangular shaped spacer). The first spacer 138a has a bottom surface 138ab and a sidewall 138as slanted relative to the bottom surface 138'b at an acute angle α4. Although the first spacers 138a illustrated in FIG. 17 have inclined sidewalls 138as, the etching process E2 may lead to vertical sidewalls 138as (resulting from over-etching during the etching process E2), as indicated by dashed line DL2, in some other embodiments.

Figure 18:
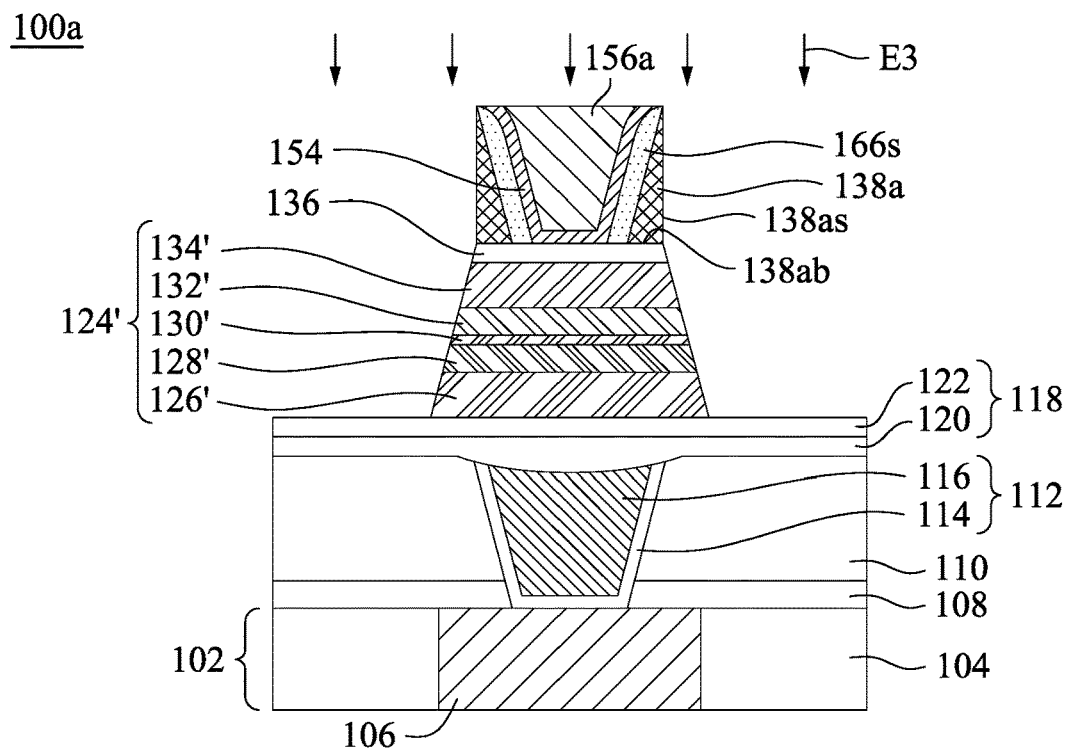

Reference is made to FIG. 18. An etching process E3 is performed to pattern the MTJ layer stack 124 to expose the bottom electrode layer 118. For example, the TaN layer 122 is exposed after the etching process E3. The etching process E3 is a self-aligned etch process. In greater detail, the etching process E3 uses the top electrode 156a, the adhesion layer 154, the third spacers 166s, and the first spacers 138a as an etch mask. The etching process E3 removes portions of the MTJ layer stack 124 not protected by the top electrodes 156', the adhesive layer 154, the third spacers 166s, and the first spacers 138' as well as removes portions of the first spacers 138a. In some embodiments, the etching process E3 may lead to vertical sidewalls 138as. After the etching process E3, remaining capping layers 134', remaining ferromagnetic free layers 132', remaining tunneling layers 130', remaining ferromagnetic pinned layers 128', and remaining seed layers 126' are in combination regarded as the MTJ stack 124'. The first spacers 138a are shown to have a geometry of a right triangle. The etching process E3 may be an anisotropic etching process, as discussed previously with regard to FIG. 10.

Figure 19:
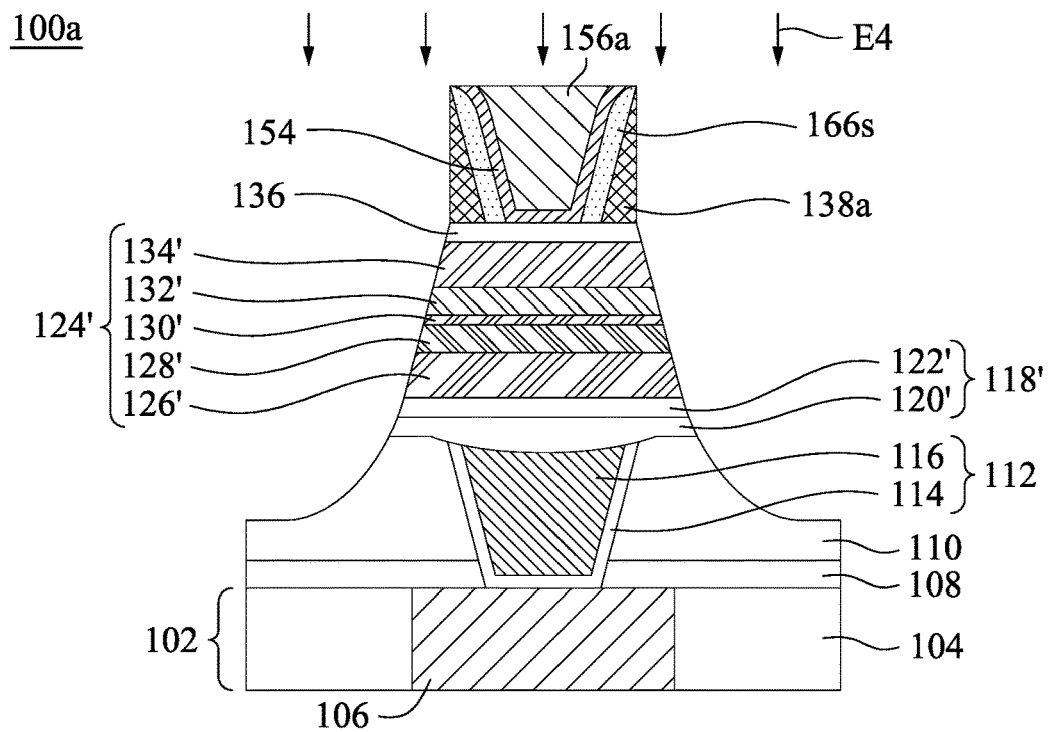
Figure 20:
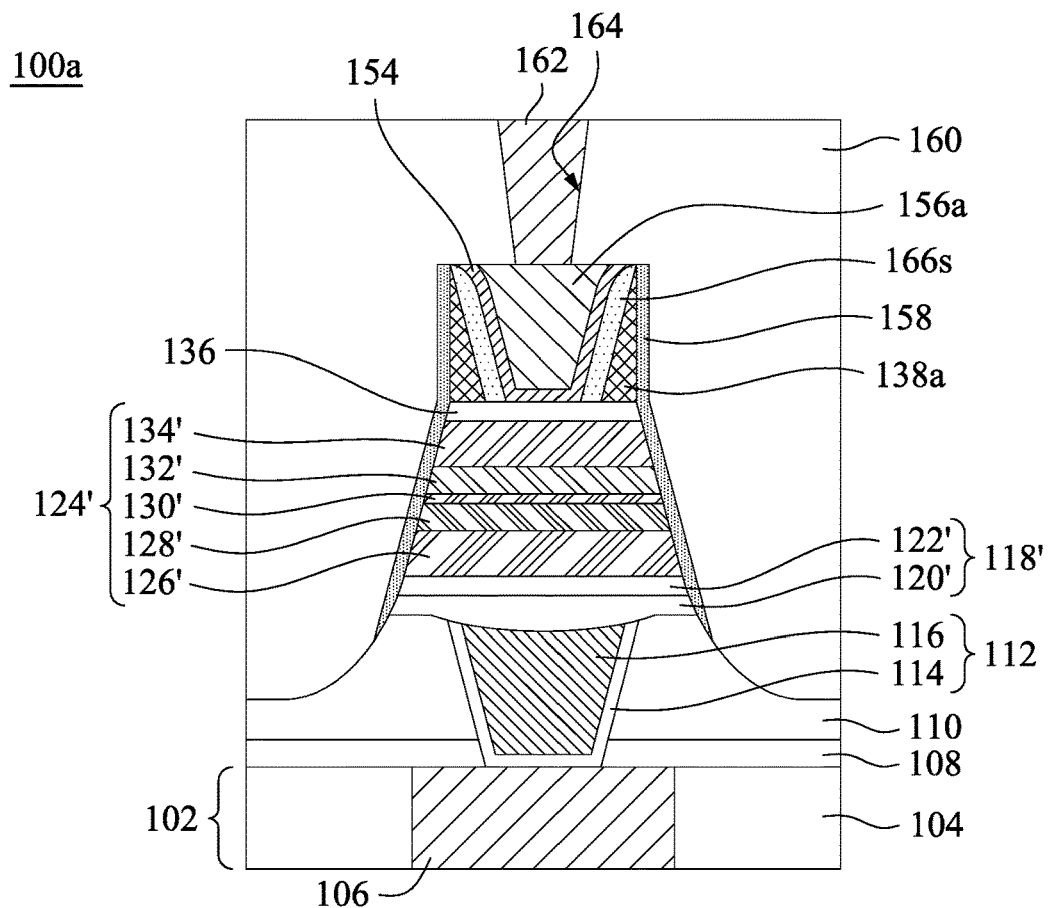

Reference is made to FIG. 19. An etching process E4 is performed to pattern the bottom electrode layer 118 and the first dielectric layer 110 such that the first dielectric layer 110 is exposed. The bottom electrode layer 118 is patterned as a bottom electrode 118' under the MTJ stack 124'. The etching process E4 can help remove sidewall dead layers. Reference is made to FIG. 20. A second spacer 158 is formed along sidewalls of the first spacers 138a, the MTJ stack 124', and the bottom electrode 118'. In greater detail, the second spacer 158 laterally surrounds the first spacers 138a the MTJ stack 124', and the bottom electrode 118'. Another ILD layer 160 is formed over the interconnect structure 102, and an upper metallization pattern 162 are then formed in the ILD layer 160. Formation of the upper metallization pattern 162 may be formed by etching an opening 164 in the ILD layer 160, as is discussed previously with regard to FIG. 12.

Figure 21:
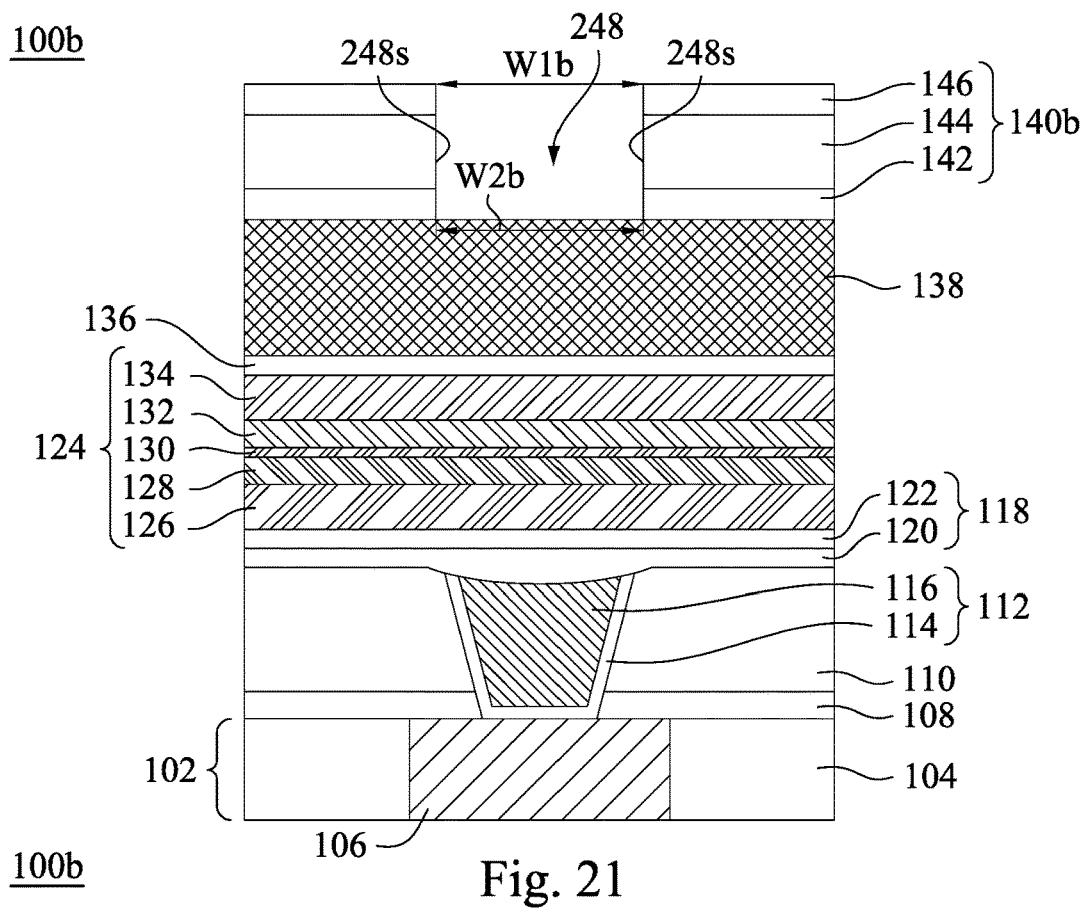
FIGS. 21-30 are cross-sectional views of the MRAM device at various intermediate stages of manufacture according to various embodiments of the present disclosure.

FIGS. 21-29 are cross-sectional views of the MRAM device 100b at various intermediate stages of manufacture according to various embodiments of the present disclosure. FIG. 21 illustrates the resulting structure after the lithography mask 140b has been patterned forming an opening 248. Reference is made to FIG. 21. The lithography mask 140b is formed on the second dielectric layer 138, as discussed previously with regard to FIG. 5B. The second dielectric layer is exposed through the opening 248, as discussed previously with regard to FIG. 5C. The opening 248 has a rectangular shape. In greater detail, a top width W1b of the opening 248 is the same as a bottom width W2b of the opening 248. The opening 248 has vertical sidewalls 248s, which in turn results in a desired rectangular profile of a subsequently formed recess.

Figure 22:
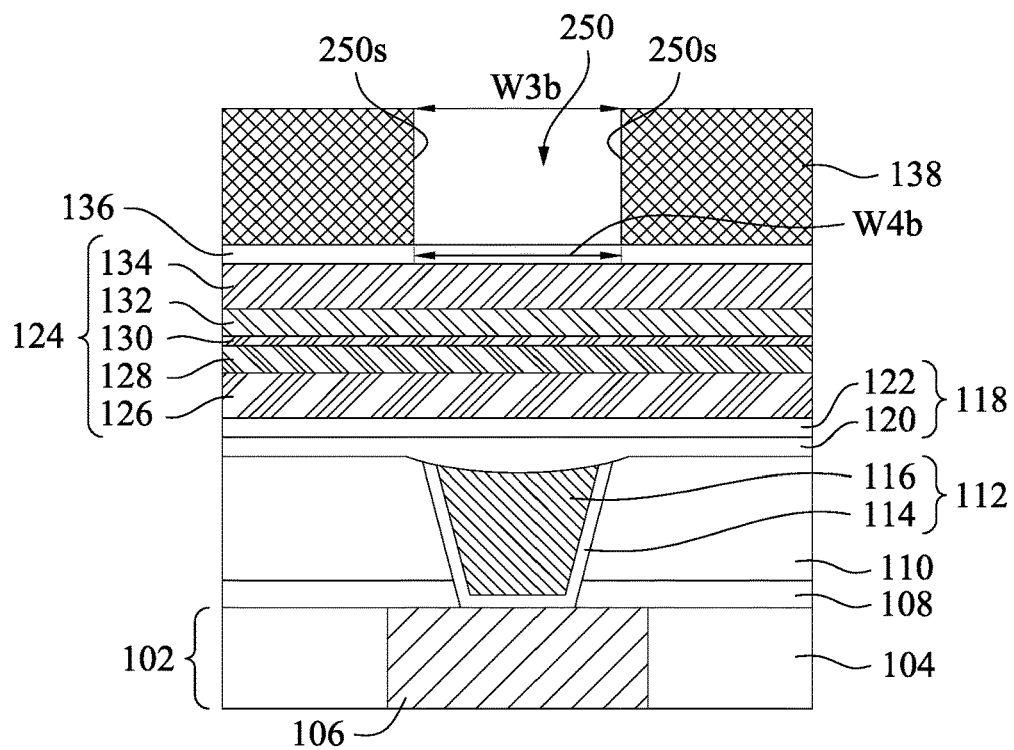

Reference is made to FIG. 22. The second dielectric layer 138 is patterned to form a recess 250 therein. The bottom layer 142, the middle layer 144 and the top photoresist layer 146 are removed thereafter. The barrier layer 136 is exposed through the recess 250. Due to the opening 248 in the lithography mask 140 with the rectangular profile, the opening 248 in the second dielectric layer 138 has a rectangular profile as well. In greater detail, a top width W3b of the recess 250 is the same as a bottom width W4b of the recess 250. The recess 250 has vertical sidewalls 250s.

Figure 23:
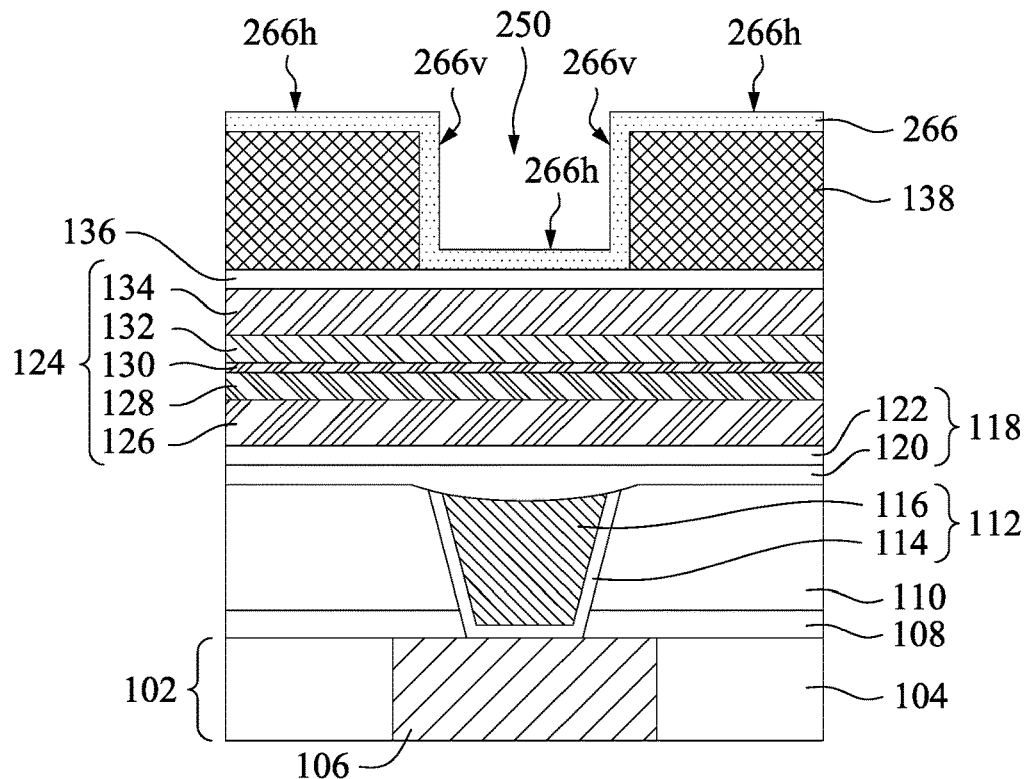

Reference is made to FIG. 23. A spacer layer 266 is conformally deposited over the second dielectric layer 138, including along the surface of the recess 250 and over the exposed surface of the barrier layer 136, as discussed previously with regard to FIG. 13. In greater detail, the spacer layer 266 has horizontal portions 266h over the second dielectric layer 138 and the barrier layer 136 and vertical portions 266v along sidewalls of recess 250. A width of the vertical portions 266v increases in a direction toward the barrier layer 136.

Figure 24:
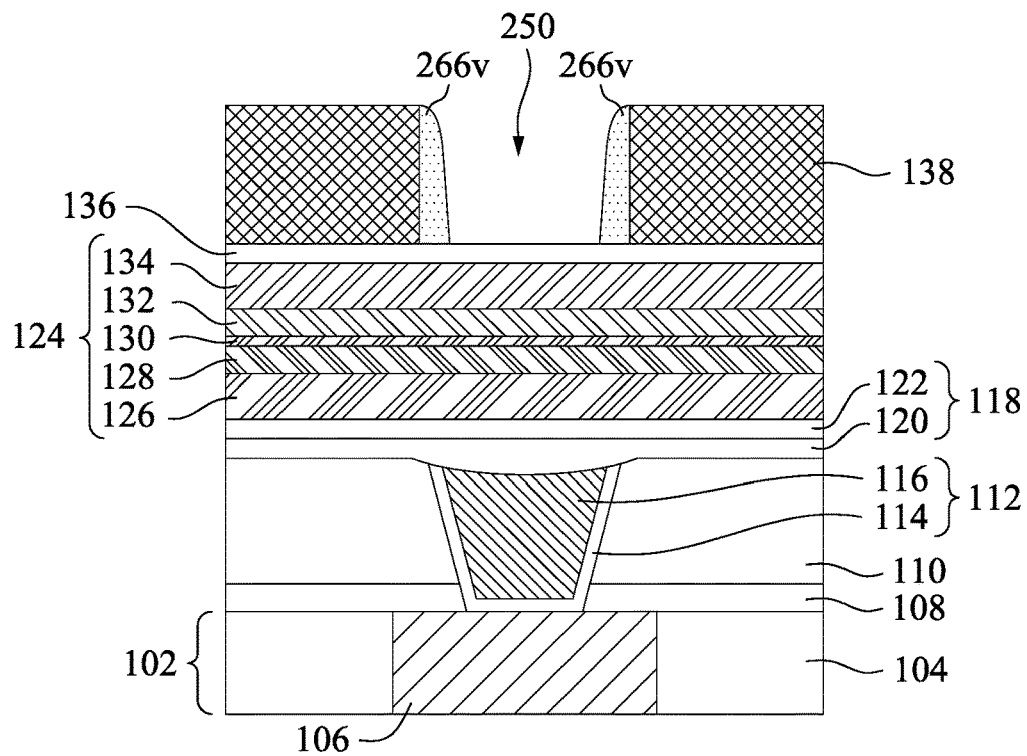

Reference is made to FIG. 24. Next, horizontal portions 266h of the spacer layer 266 are removed, and vertical portions 266v of the spacer layer 266 remain on sidewalls of the recess 250 to serve as third spacers 266v. Removal of the horizontal portions of the spacer layer 266 can be performed using, for example, an anisotropic etching process (e.g., dry etching). The barrier layer 136 is exposed as a result of removing the horizontal portions 266h over the barrier layer 136. Advantageously, the third spacer 266v results in reduced critical dimensions (CD) for a subsequently formed top electrode.

Figure 25:
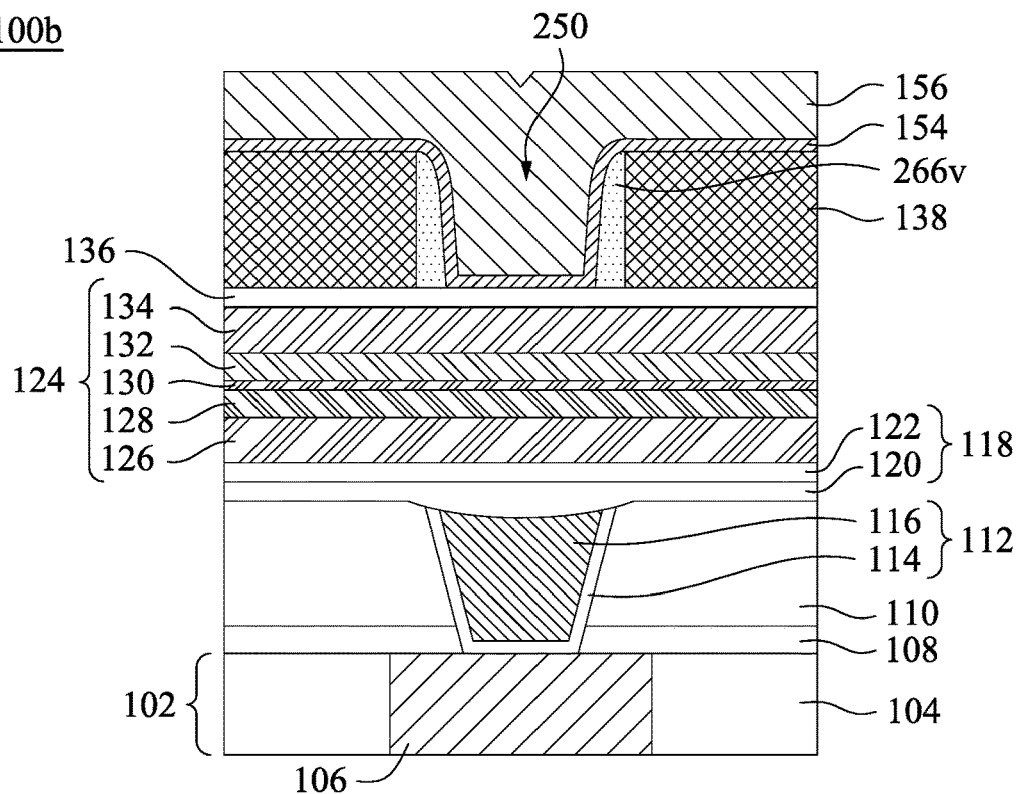

Reference is made to FIG. 25. An adhesion layer 154 is conformally deposited over the second dielectric layer 138, including along the surface of the third spacers 266v and over the exposed surface of the barrier layer 136. A top electrode layer 156 is formed over the adhesion layer 154 and fills the recess 250.

Figure 26:
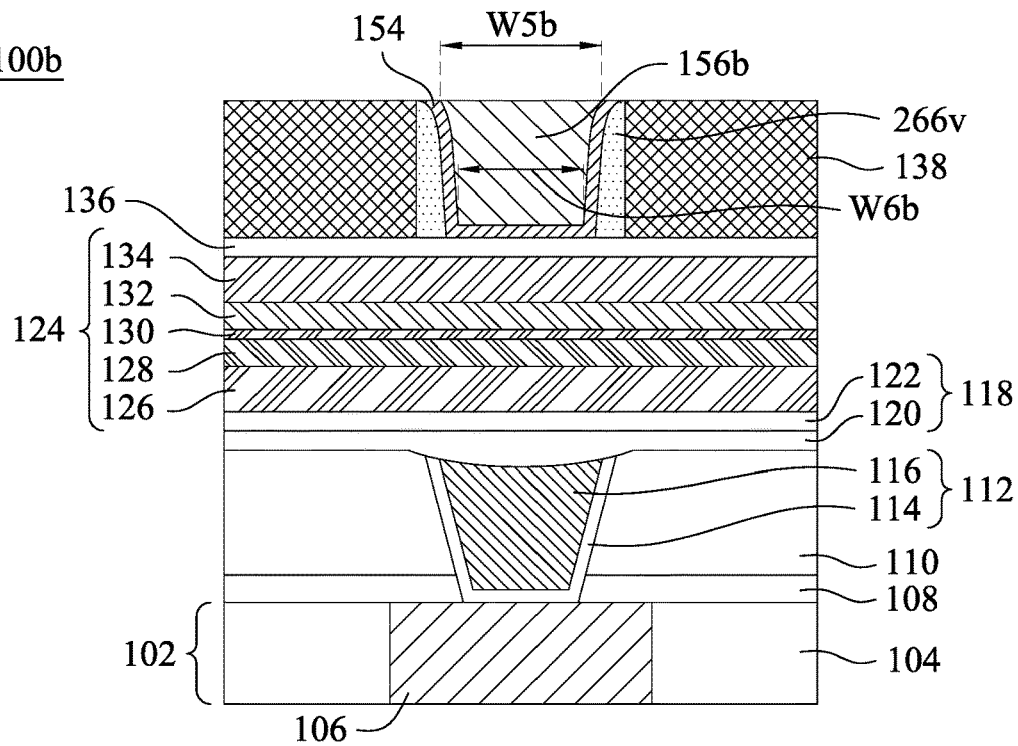

Reference is made to FIG. 26. A portion of the top electrode layer 156 outside the recess 250 is removed, for example, through a CMP process, as discussed previously with respect to FIG. 8. In some embodiments, the top width W5b of the top electrode 156b is in a range from about 250 Angstroms to about 1050 Angstroms. In some embodiments, the bottom width W6b of the top electrode 156b is in a range from about 200 Angstroms to about 800 Angstroms.

Figure 27:
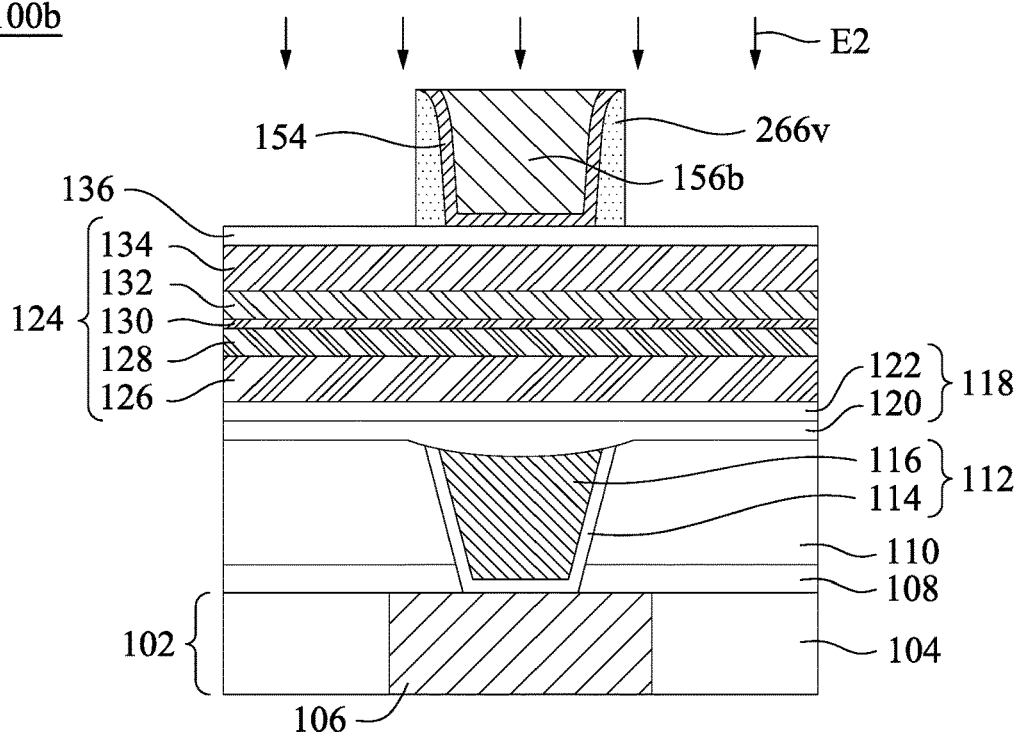

Reference is made to FIG. 27. An etching process E2 is performed to pattern the second dielectric layer 138 to expose the barrier layer 136, as discussed previously with regard to FIG. 9. Patterning the MTJ layer stack 124 stops on the bottom electrode layer 118. During the etching process E2, the third spacers 266v remain on the sidewalls of the top electrode 156b.

Figure 28:
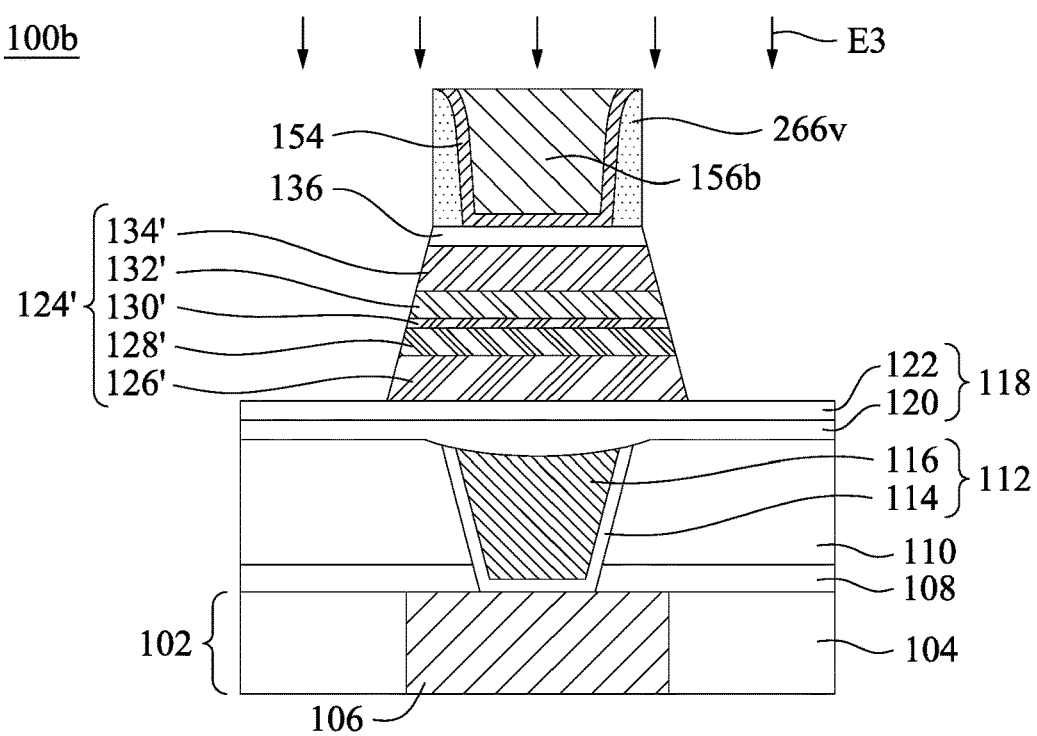

Reference is made to FIG. 28. An etching process E3 is performed to pattern the MTJ layer stack 124 to expose the bottom electrode layer. For example, the TaN layer 122 is exposed after the etching process E3. The etching process E3 is a self-aligned etch process. In greater detail, the etching process E3 uses the top electrode 156', the adhesion layer 154 and the third spacers 266v as an etch mask. The etching process E3 removes portions of the MTJ layer stack 124 not protected by the top electrodes 156b, the adhesive layer 154 and the third spacers 266'. After the etching process E3, remaining capping layers 134', remaining ferromagnetic free layers 132', remaining tunneling layers 130', remaining ferromagnetic pinned layers 128', and remaining seed layers 126' are in combination regarded as the MTJ stack 124'.

The etching process E3 may be an anisotropic etching process. For example, the etching process E3 is a dry etching process, for example, an ion beam etch (IBE) process. The third spacers 266v reduce the likelihood of damage, and/or the re-deposition of by-products on sidewalls of the top electrode 156b caused by the etching process E3. Such damage and/or re-deposition leads to increased leakage current and/or reduced data retention in a memory cell. In some embodiments, etchants used in the etching process E3 includes alkanols, such as methanol ($CH_3OH$). The etching process E3 may lead to formation of sidewall dead layers surrounding sidewalls of the MTJ stack 124'. Such dead layers inevitably will result in current shunting, and thus reduce DR/R signal of the MRAM device.

Figure 29:
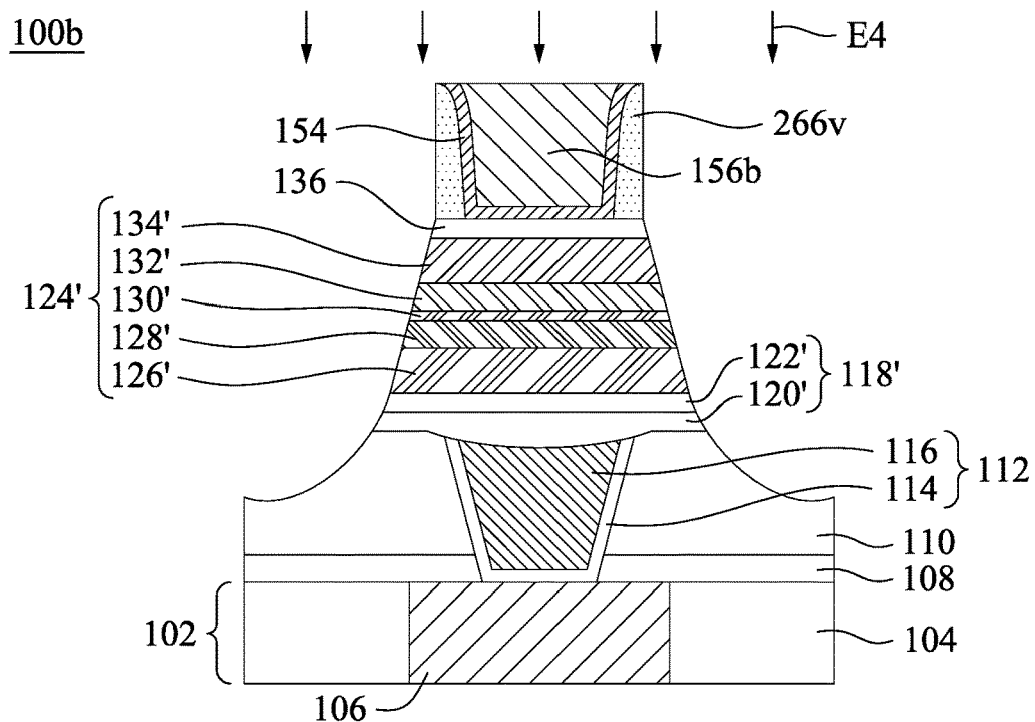
Figure 30:
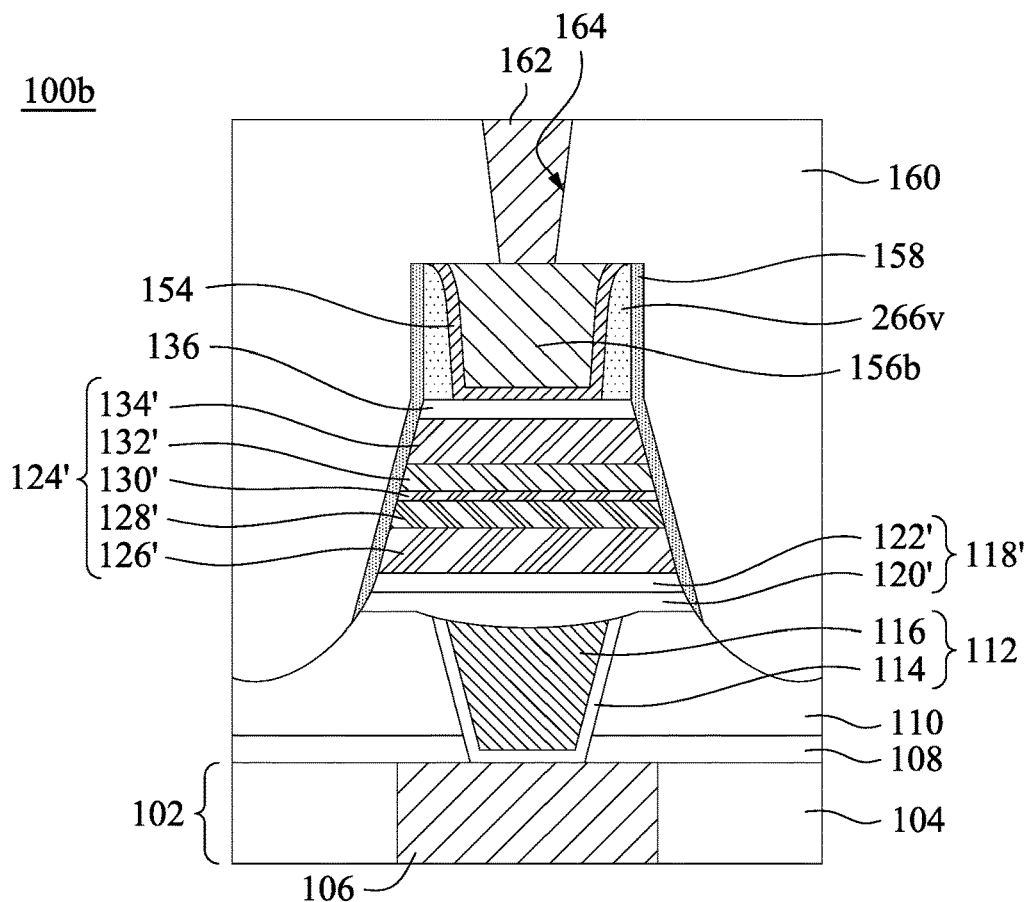

Reference is made to FIG. 29. An etching process E4 is performed to pattern the bottom electrode layer 118 and the first dielectric layer 110 such that the first dielectric layer 110 is exposed. The bottom electrode layer 118 is patterned as a bottom electrode 118' under the MTJ stack 124'. The etching process E4 can help remove sidewall dead layers. Reference is made to FIG. 30. A second spacer 158 is formed along sidewalls of the third spacers 266v, the MTJ stack 124', and the bottom electrode 118'. In greater detail, the second spacer 158 laterally surrounds the third spacers 266v, the MTJ stack 124', and the bottom electrode 118'. Another ILD layer 160 is formed over the interconnect structure 102, and an upper metallization pattern 162 are then formed in the ILD layer 160. Formation of the upper metallization pattern 162 may be formed by etching an opening 164 in the ILD layer 160, as is discussed previously with regard to FIG. 12.

Figure 31:
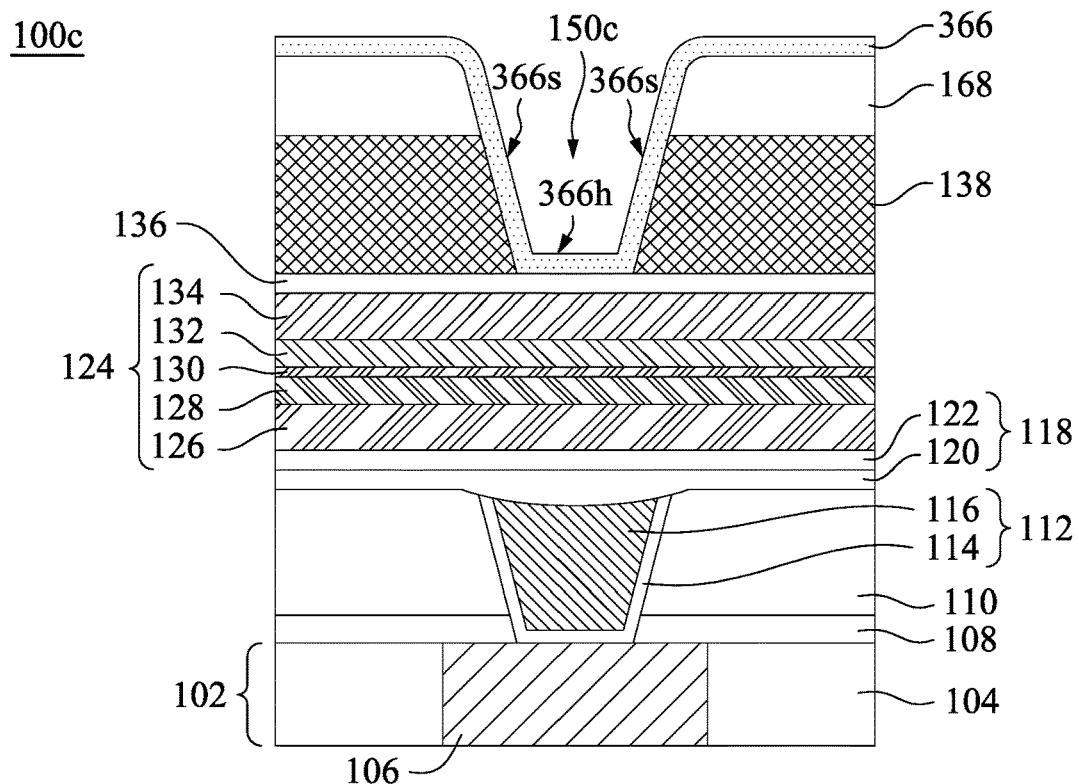
FIGS. 31-33 are cross-sectional views of the MRAM device at various intermediate stages of manufacture according to various embodiments of the present disclosure.
Figure 32:
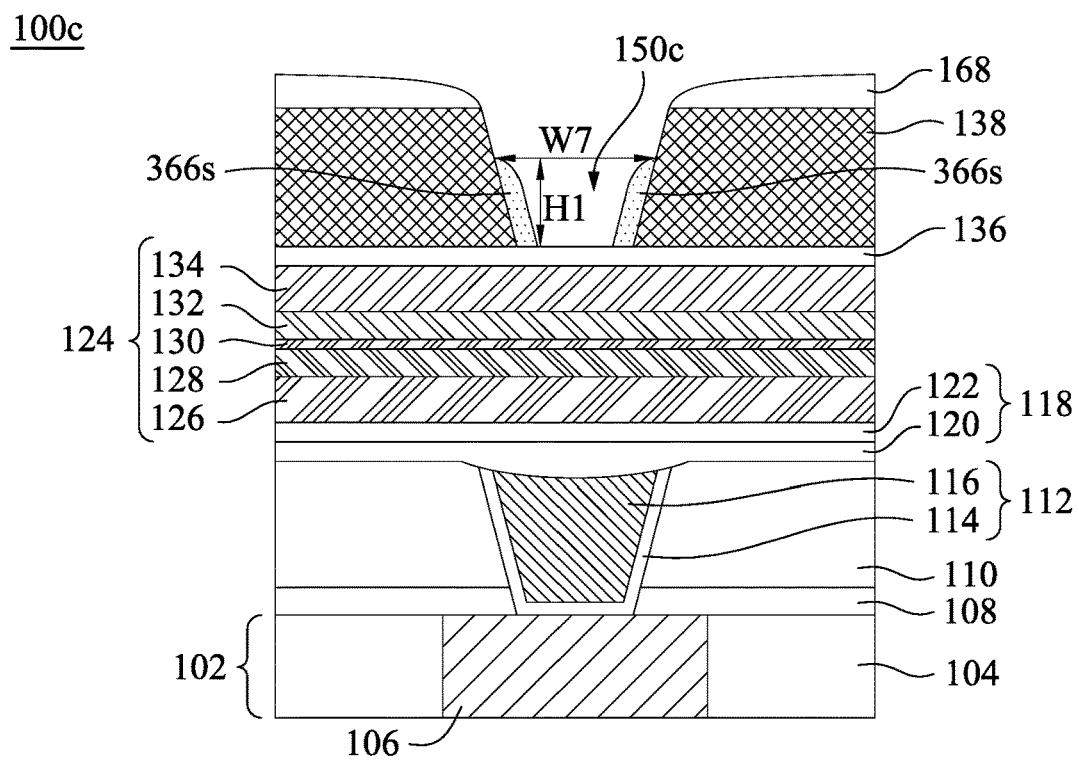
Figure 33:
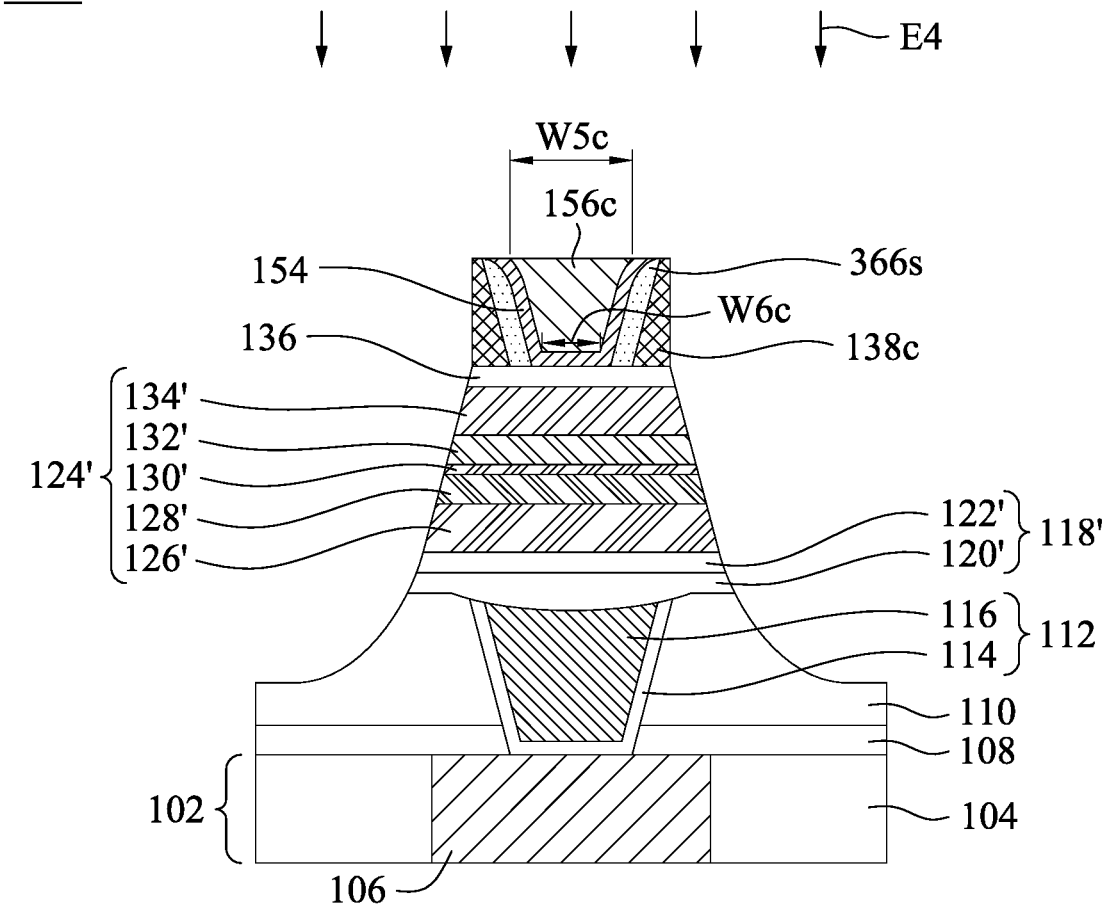

FIGS. 31-33 are cross-sectional views of the MRAM device at various intermediate stages of manufacture according to various embodiments of the present disclosure. Reference is made to FIG. 31. A nitrogen free anti-reflective coating (NFARC) layer 168 is formed on the second dielectric layer 138. A spacer layer 366 is conformally deposited over the NFARC layer 168, including along the surface of the recess 150c and over the exposed surface of the barrier layer 136. In greater detail, the spacer layer 366 has horizontal portions 366h over the NFARC layer 168 and the barrier layer 136 and slanted portions 366s along sidewalls of recess 150c. Due to the tapered profile of the recess 150c, the slanted portions 366s of the spacer layer 366 are slanted relative to the top surface of the barrier layer 136 at an angle. The spacer layer 366 may be formed by ALD or other suitable technique. In some embodiments, the spacer layer 366 may include aluminum oxide, titanium oxide, silicon nitride, or the like. The NFARC layer 168 has a thickness in a range from about 30 nm to about 40 nm. The second dielectric layer has a thickness in a range from about 41 nm to about 45 nm.

Reference is made to FIG. 32. Next, horizontal portions 366h of the spacer layer 366, a portion of the slanted portions 366s and a portion of the NFARC layer 168 are removed, and a portion of the slanted portions 366s of the spacer layer 366 remain extending along sidewalls of the recess 150c. The slanted portions 366s may be regarded as sidewall spacers. Removal of the horizontal portions 366h of the spacer layer 366 can be performed using, for example, an anisotropic etching process (e.g., dry etching). Removal of the portion of the slanted portions 366s of the spacer layer 366 can be performed using, for example, an anisotropic etching process (e.g., dry etching). The barrier layer 136 is exposed as a result of removing the horizontal portions 366h over the barrier layer 136. Advantageously, the slanted portions 366s of the spacer layer 366 result in reduced critical dimensions (CD) for a subsequently formed top electrode. The slanted portions 366s of the spacer layer 366 may be regarded as third spacers 366s hereafter. The slanted portions 366s have a vertical height H1 in a range from about 40 nm to about 55 nm. A spacing W7 between tops of the slanted portions 366s is in a range from about 30 nm to about 50 nm. The NFARC layer 168 has a thickness in a range from about 10 nm to about 20 nm.

Reference is made to FIG. 33. An adhesion layer 154 is conformally deposited over the second dielectric layer 138, including along the surface of the third spacers 366s and over the exposed surface of the barrier layer 136. The adhesion layer 154 may be formed by PVD, CVD, ALD, or other suitable technique. In some embodiments, the adhesion layer 154 is a Ta-containing layer, for example, TaN. A top electrode layer (not shown) is formed over the adhesion layer 154 and fills the recess 150c. In some embodiments, the top electrode layer includes TiN.

A portion of the top electrode layer outside the recess 150c is removed, for example, through a CMP process, and hence forming a top electrode 156c, as discussed previously with respect to FIG. 8. In some embodiments, a chemical mechanical polishing (CMP) process is performed on the top electrode layer to etch back and planarize the top electrode layer until the third spacers 366s are reached and exposed. The CMP process may selectively stop at the third spacers 366s, completing the formation of the top electrode 156c. Due to the inverted trapezoid profile of the recess 150c, the top electrode 156c has an inverted trapezoid profile as well. In other words, a top width W5c of the top electrode 156c is greater than a bottom width W6c of the top electrode 156c. In some embodiments, the top width W5c is in a range from about 200 Angstroms to about 1050 Angstroms. In some embodiments, the bottom width W6c is in a range from about 200 Angstroms to about 800 Angstroms.

An etching process is performed to pattern the second dielectric layer 138 to expose the barrier layer 136. After the etching process, the second dielectric layer 138 is patterned as first spacers 138c extend along sidewalls of the third spacers 366s, respectively. The first spacers 138c are formed as triangular geometry spacers (triangular shaped spacer).

An etching process is performed to pattern the MTJ layer stack 124 to expose the bottom electrode layer 118. After the etching process E3, remaining capping layers 134', remaining ferromagnetic free layers 132', remaining tunneling layers 130', remaining ferromagnetic pinned layers 128', and remaining seed layers 126' are in combination regarded as the MTJ stack 124'.

An etching process E4 is performed to pattern the bottom electrode layer 118 and the first dielectric layer 110 such that the first dielectric layer 110 is exposed. The bottom electrode layer 118 is patterned as a bottom electrode 118' under the MTJ stack 124'. The etching process E4 can help remove sidewall dead layers.

Figure 34:
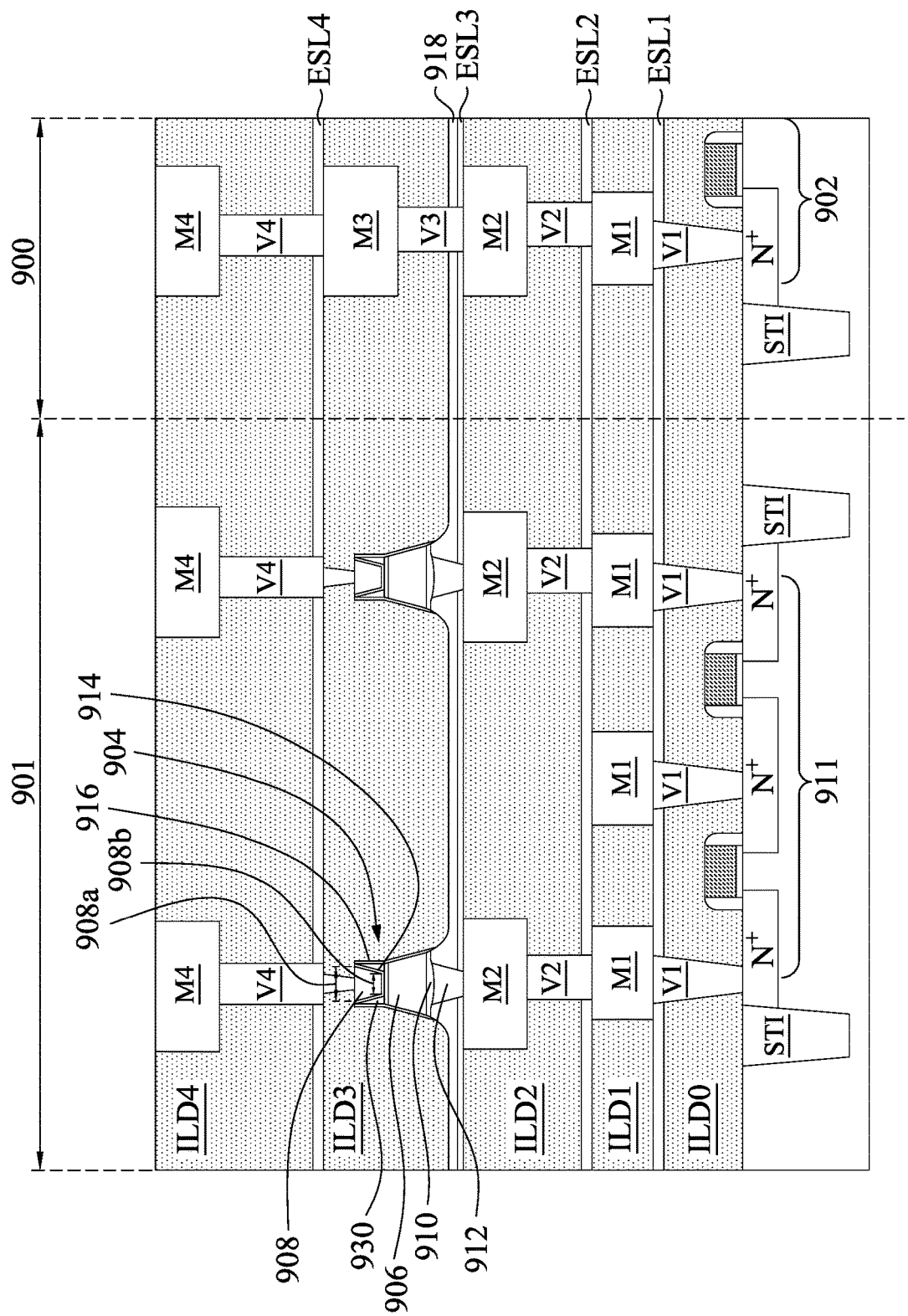
FIG. 34 illustrates an integrated circuit including MRAM devices and logic devices.

FIG. 34 illustrates an integrated circuit including MRAM devices and logic devices. The integrated circuit includes a logic region 900 and a MRAM region 901. Logic region may 900 include circuitry, such as the exemplary transistor, for processing information received from MRAM devices 904 in the MRAM region 901 and for controlling reading and writing functions of MRAM devices 920. In some embodiments, the MRAM device 904 includes an MTJ stack 906, a top electrode 908 over the MTJ stack 906, a bottom electrode 910 under the MTJ stack 906, and a BEVA 912 under the bottom electrode 910. The top width 908a of the top electrode 908 is greater than a bottom width 908b of the top electrode 908. The MRAM device 904 includes spacers 914 surrounding sidewalls of the top electrode 908, such that an unwanted damage and/or re-deposition during etching the MTJ layer stack can be prevented. The MRAM device 904 further includes spacers 916 laterally surrounds the spacers 914, the MTJ stack 906', and the bottom electrode 910.

As depicted, the integrated circuit is fabricated using five metallization layers, labeled as M1 through M4, with five layers of metallization vias or interconnects, labeled as V2 through V4. Other embodiments may contain more or fewer metallization layers and a corresponding more or fewer number of vias. Logic region 900 includes a full metallization stack, including a portion of each of metallization layers M1-M4 connected by interconnects V2-V4, with M1 connecting the stack to a source/drain contact of logic transistor 902. The MRAM region 901 includes a full metallization stack connecting MRAM devices 920 to transistors 911 in the MRAM region 901, and a partial metallization stack connecting a source line to transistors 911 in the MRAM region 901. MRAM devices 920 are depicted as being fabricated in between the top of the M2 layer and the bottom the M4 layer. Also included in integrated circuit is a plurality of ILD layers. Five ILD layers, identified as ILD0 through ILD4 are depicted in FIG. 11 as spanning the logic region 900 and the MRAM region 901. The ILD layers may provide electrical insulation as well as structural support for the various features of the integrated circuit during many fabrication process steps. The ILD layers between two metallization layers may include etch stop layers, identified as ESL1-ESL4 therebetween to signaling the termination point of an etching process and protect any underlying layer or layers during the etching process.

Based on the above discussions, it can be seen that the present disclosure offers advantages. It is understood, however, that other embodiments may offer additional advantages, and not all advantageous are necessarily disclosed herein, and that no particular advantage is required for all embodiments. One advantage is that defects in the MTJ stack which are caused by etching TiN top electrode using chlorine etchants can be prevented. Another advantage is that the damage and/or the re-deposition of by-products on sidewalls of the TiN top electrode caused by the etching process can be reduced by the first spacers. Therefore, leakage current and/or reduced data retention in a memory cell may be prevented. Moreover, another advantage is that the slanted portions of the spacer layer result in reduced critical dimensions (CD) for the subsequently formed top electrode.

According to some embodiments, a method of forming a magnetic random access memory (MRAM) device includes forming a bottom electrode layer over a substrate including an inter-metal dielectric (IMD) layer having a metal line therein; forming a barrier layer over the bottom electrode layer; forming a magnetic tunnel junction (MTJ) layer stack over the bottom electrode layer; forming a dielectric layer over the MTJ layer stack; forming an opening in the dielectric layer to expose the barrier layer; filling the opening in the dielectric layer with a top electrode; after filling the opening in the dielectric layer with the top electrode, etching the dielectric layer to expose the barrier layer; and patterning the MTJ layer stack to form an MTJ stack that exposes the bottom electrode layer.

According to some embodiments, a method of forming a magnetic random access memory (MRAM) device includes forming a magnetic tunnel junction (MTJ) layer stack over a substrate including an inter-metal dielectric (IMD) layer having a metal line therein; forming a dielectric layer over the MTJ layer stack; forming an opening in the dielectric layer; depositing a spacer layer to line the opening; performing an anisotropic etching process to remove horizontal portions of the spacer layer, in which other portions of the spacer layer remain on sidewalls of the opening; and after performing the anisotropic etching process, filling the opening with a metal material of a top electrode.

According to some embodiments, a magnetic random access memory (MRAM) device includes a substrate, a bottom electrode, a MTJ stack, a titanium-containing top electrode, and a spacer. The substrate includes an inter-metal dielectric (IMD) layer having a metal line. The bottom electrode is over the metal line. The MTJ stack is over the bottom electrode. The MTJ stack includes a pinned layer, a tunnel barrier layer and a free layer. The tunnel barrier layer is over the pinned layer. The free layer is over the tunnel barrier layer. The titanium-containing top electrode is over the MTJ stack. A top width of the titanium-containing top electrode is greater than a bottom width of the titanium-containing top electrode. The spacer extends along sidewalls of the titanium-containing top electrode and over a top surface of the MTJ stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a magnetic random access memory (MRAM) device, the method comprising:
   forming a bottom electrode layer over a substrate comprising an inter-metal dielectric (IMD) layer having a metal line therein;
   forming a barrier layer over the bottom electrode layer;
   forming a magnetic tunnel junction (MTJ) layer stack over the bottom electrode layer;
   forming a dielectric layer over the MTJ layer stack;
   forming an opening in the dielectric layer to expose the barrier layer;
   filling the opening in the dielectric layer with a top electrode;
   after filling the opening in the dielectric layer with the top electrode, etching the dielectric layer to expose the barrier layer; and
   patterning the MTJ layer stack to form an MTJ stack that exposes the bottom electrode layer.

2. The method of claim 1, wherein a portion of the dielectric layer remains on at least a sidewall of the top electrode after etching the dielectric layer.

3. The method of claim 1, wherein the dielectric layer has a reduced bottom surface after patterning the MTJ layer stack.

4. The method of claim 3, wherein patterning the MTJ layer stack partially removes a portion of the dielectric layer.

5. The method of claim 1, further comprising:
   patterning the bottom electrode layer after patterning the MTJ layer stack.

6. The method of claim 5, wherein patterning the MTJ layer stack stops on the bottom electrode layer.

7. The method of claim 1, further comprising:
   forming a sidewall spacer lining a sidewall of the opening in the dielectric layer prior to filling the opening with the top electrode.

8. The method of claim 1, further comprising:
   forming a lithography mask over the dielectric layer prior to forming an opening in the dielectric layer.

9. The method of claim 1, wherein the opening has an inverted trapezoid shape when view in a cross section.

10. A method of forming a magnetic random access memory (MRAM) device, the method comprising:
    forming a magnetic tunnel junction (MTJ) layer stack over a substrate comprising an inter-metal dielectric (IMD) layer having a metal line therein;
    forming a dielectric layer over the MTJ layer stack;
    forming an opening in the dielectric layer;
    depositing a spacer layer to line the opening;
    performing an anisotropic etching process to remove first portions of the spacer layer, wherein second portions of the spacer layer remain on sidewalls of the opening;
    after performing the anisotropic etching process, filling the opening with a metal material of a top electrode; and
    after filling the opening with the metal material of the top electrode, removing a first portion of the dielectric layer by etching while leaving second portions of the dielectric layer on sidewalls of the second portions of the spacer layer.

11. The method of claim 10, further comprising:
    forming a tantalum-containing layer to line the opening prior to filling the opening with the metal material of the top electrode and after performing the anisotropic etching process.

12. The method of claim 11, further comprising:
    performing a chemical mechanical polish (CMP) process to remove a portion of the metal material of the top electrode and a portion of the tantalum-containing layer outside the opening in the dielectric layer.

13. The method of claim 10, further comprising:
    planarizing the metal material of the top electrode to expose a top surface of the dielectric layer.

14. The method of claim 10, wherein etching the dielectric layer exposes the MTJ layer stack.

15. The method of claim 14, wherein etching the dielectric layer is performed using the metal material of the top electrode as an etch mask.

16. The method of claim 14, wherein the second portions of the spacer layer remain around the metal material of the top electrode after etching the dielectric layer.

17. The method of claim 14, further comprising:
    forming a barrier layer over the MTJ layer stack prior to forming the dielectric layer.

18. The method of claim 17, wherein a top surface of the barrier layer is exposed after etching the dielectric layer.

19. A magnetic random access memory (MRAM) device, comprising:
    a substrate comprising an inter-metal dielectric (IMD) layer having a metal line;
    a bottom electrode over the metal line;
    a MTJ stack over the bottom electrode, comprising:
       a pinned layer;
       a tunnel barrier layer over the pinned layer; and
       a free layer over the tunnel barrier layer;
    a titanium-containing top electrode over the MTJ stack, wherein a top width of the titanium-containing top electrode is greater than a bottom width of the titanium-containing top electrode; and
    a spacer extending along sidewalls of the titanium-containing top electrode and over a top surface of the MTJ stack.

20. The device of claim 19, further comprising a tantalum-containing layer laterally surrounding the titanium-containing top electrode.

* * * * *